US011201194B2

(12) United States Patent
Noh et al.

(10) Patent No.: US 11,201,194 B2
(45) Date of Patent: Dec. 14, 2021

(54) DISPLAY DEVICE

(71) Applicant: Samsung Display Co., Ltd., Yongin-si (KR)

(72) Inventors: Jung Hun Noh, Yongin-si (KR); Yi Joon Ahn, Seoul (KR); Jae Woo Im, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 4 days.

(21) Appl. No.: 16/296,251

(22) Filed: Mar. 8, 2019

(65) Prior Publication Data

US 2020/0043991 A1    Feb. 6, 2020

(30) Foreign Application Priority Data

Aug. 6, 2018    (KR) .................. 10-2018-0091069

(51) Int. Cl.
*H01L 27/32*   (2006.01)
*H04R 1/02*    (2006.01)
*H05K 7/20*    (2006.01)
*G09G 3/34*    (2006.01)

(52) U.S. Cl.
CPC ......... *H01L 27/3225* (2013.01); *H04R 1/028* (2013.01); *G09G 3/344* (2013.01); *H04R 2499/11* (2013.01); *H04R 2499/15* (2013.01); *H05K 7/20963* (2013.01); *H05K 2201/10128* (2013.01)

(58) Field of Classification Search
CPC . H01L 27/3225; H04R 1/028; H04R 2499/11; H04R 2499/15; H05K 2201/10128; H05K 7/20963; G09G 3/344
See application file for complete search history.

(56) References Cited

U.S. PATENT DOCUMENTS

| | | | | |
|---|---|---|---|---|
| 8,879,766 | B1* | 11/2014 | Zhang | H04R 7/045 381/333 |
| 2003/0220061 | A1* | 11/2003 | Prasad | B24B 37/24 451/526 |
| 2004/0119410 | A1* | 6/2004 | Jun | H05K 7/20963 313/582 |
| 2006/0227981 | A1* | 10/2006 | Miyata | H04R 7/04 381/124 |
| 2007/0197949 | A1* | 8/2007 | Chen | C09J 153/025 602/41 |
| 2007/0202917 | A1* | 8/2007 | Phelps | H04R 7/045 455/556.1 |
| 2008/0117165 | A1* | 5/2008 | Machida | G09G 3/3446 345/107 |

(Continued)

FOREIGN PATENT DOCUMENTS

KR    10-2019-0126955        11/2019
WO    WO-2018204648 A1 *    11/2018    ......... H01L 51/5275

*Primary Examiner* — Sunita Joshi
*Assistant Examiner* — Kuassi A Ganmavo
(74) *Attorney, Agent, or Firm* — H.C. Park & Associates, PLC

(57) ABSTRACT

The display device comprises: a display panel; a sound generator under the display panel; a frame disposed under the display panel and the sound generator; and a porous layer disposed adjacent to the sound generator between the display panel and the frame and having a plurality of air pockets, wherein the porous layer has a porosity of about 90% or more.

20 Claims, 29 Drawing Sheets

(56) References Cited

U.S. PATENT DOCUMENTS

| | | | |
|---|---|---|---|
| 2008/0315166 A1* | 12/2008 | Gagnon | B66D 3/12 |
| | | | 254/133 R |
| 2012/0275013 A1* | 11/2012 | Hayashi | G02B 26/026 |
| | | | 359/296 |
| 2013/0032132 A1* | 2/2013 | Yantis | F24C 15/02 |
| | | | 126/192 |
| 2013/0228392 A1* | 9/2013 | Iwata | G10K 11/08 |
| | | | 181/148 |
| 2014/0306260 A1* | 10/2014 | Yamazaki | H01L 51/5012 |
| | | | 257/99 |
| 2015/0078604 A1* | 3/2015 | Seo | G06F 1/1635 |
| | | | 381/333 |
| 2015/0341714 A1* | 11/2015 | Ahn | H04M 1/03 |
| | | | 381/333 |
| 2015/0343392 A1* | 12/2015 | Hikita | B01D 69/02 |
| | | | 521/134 |
| 2017/0134546 A1* | 5/2017 | Nishiwaki | H04M 1/026 |
| 2017/0280216 A1* | 9/2017 | Lee | H04R 5/02 |
| 2019/0004566 A1* | 1/2019 | Lee | H04R 9/06 |
| 2019/0037164 A1* | 1/2019 | Kim | H04N 5/642 |
| 2019/0141450 A1* | 5/2019 | Yoon | H04R 7/045 |
| 2019/0341433 A1 | 11/2019 | Im et al. | |
| 2020/0347200 A1* | 11/2020 | Dehn | C08J 9/0066 |

\* cited by examiner

DISPLAY DEVICE

CROSS REFERENCE TO RELATED APPLICATION

This application claims priority from and the benefit of Korean Patent Application No. 10-2018-0091069, filed on Aug. 6, 2018, which is hereby incorporated by reference for all purposes as if fully set forth herein.

BACKGROUND

Field

Exemplary implementations of the invention relate generally to a display device, and more particularly, to a display device having a panel speaker feature.

Discussion of the Background

Electronic devices that provide images to a user such as a smart phone, a digital camera, a laptop computer, a navigation device and a TV include a display device for displaying images. A display device includes a display panel for generating and displaying images, and a panel support sheet disposed under the display panel. The panel support sheet may include various functional sheets for protecting the display panel from heat, external shock, and the like.

A display device may further include a means for outputting sound. In order to output sound, typically a speaker including a diaphragm is incorporated in a display device. However, when a speaker including a separate diaphragm is mounted on the display device, the manufacturing cost may be increased and the thickness of the display device may be increased.

The above information disclosed in this Background section is only for understanding of the background of the inventive concepts, and, therefore, it may contain information that does not constitute prior art.

SUMMARY

Display devices constructed according to exemplary implementations of the invention provide improved acoustic characteristics by integrating a sound generator, into the display panel such that the display panel itself may serve as a diaphragm.

When the display device utilizes the display panel as the diaphragm in accordance with the principles and exemplary implementations of the invention, no additional speaker is required, so that the size of the display device can be reduced and the structure of the display device can be simplified. Further, when a display panel having a relatively large area is utilized as the diaphragm, the display device can exhibit better acoustic and low-frequency output characteristics.

For example, exemplary implementations may employ a porous layer having a gel structure with air pockets therein to enable a display panel to vibrate independently of a frame, thereby improving the acoustic characteristics of the display device.

In addition, the air pockets included in the porous layer are generally connected with one another, such that the space where the sound generator is disposed is connected to another empty space, such as the battery compartment, to form a single resonance space, thereby improving the acoustic characteristics of the display device.

Additional features of the inventive concepts will be set forth in the description which follows, and in part will be apparent from the description, or may be learned by practice of the inventive concepts.

According to an aspect of the invention a display device includes: a display panel; a sound generator under the display panel; a frame at least partially surrounding the sound generator; and a porous layer disposed adjacent to the sound generator between the display panel and the frame and having a plurality of air pockets, wherein the porous layer has a porosity of about 90% or more.

The porous layer may have a network structure.

Two or more of the air pockets may be spatially interconnected.

The air pockets may be staggered in a horizontal direction so there is no continuous connection in the porous layer along a path formed by the shortest distance between are the frame and the display panel, and the display panel may be vibratable independently of the frame.

An average diameter of the air pockets may be greater than about 20 nm and less than about 50 nm in a cross-sectional view.

An average diameter of the air pockets may be greater than about 50 nm in a cross-sectional view, and the porous layer has a methoxy group.

The porous layer has a modulus ranging from about 0.5 MPa to about 0.05 MPa.

The porous layer includes silicon dioxide ($SiO_2$).

The sound generator and frame may be disposed under the display panel. The porous layer may include: a first coupling layer overlapping the sound generator and attached to a lower surface of the sound generator; a second coupling layer attached to an upper surface of the frame; and an intermediate layer interposed between the first coupling layer and the second coupling layer and coupled to the first and second coupling layers, wherein the intermediate layer comprises the air pockets.

The display device further comprising: a shock-absorbing layer may define a hole corresponding to an outer periphery of the sound generator and disposed between the display panel and the porous layer to surround side surfaces of the sound generator, therein an upper surface of the first coupling layer comes in contact with a lower surface of the sound generator and a lower surface of the shock-absorbing layer.

The porous layer may include: a first coupling layer defining a hole corresponding to an outer periphery of the sound generator and abutting the sound generator, a second coupling layer attached to an upper surface of the frame, and an intermediate layer interposed between the first and second coupling layers and comprising the air pockets, wherein the intermediate layer abuts a lower surface of the sound generator through the hole of the first coupling layer.

The display device may further include: a shock-absorbing layer defining a hole corresponding to an outer periphery of the sound generator and disposed between the display panel and the porous layer to surround side surfaces of the sound generator, wherein the porous layer includes a second coupling layer attached to an upper surface of the frame, and an intermediate layer disposed on the second coupling layer and comprising the air pockets, wherein the intermediate layer abuts a lower surface of the sound generator and a lower surface of the shock-absorbing layer.

The display device may further include: a shock-absorbing layer defining a hole corresponding to an outer periphery of the sound generator and disposed between the display panel and the porous layer to surround side surfaces of the sound generator, wherein the porous layer comprises a first coupling layer attached to a lower surface of the sound generator and a lower surface of the shock-absorbing layer, and an intermediate layer disposed under the first coupling layer and includes the air pockets, wherein the intermediate layer abuts an upper surface of the frame.

The porous layer may include a second coupling layer attached to an upper surface of the frame, and an intermediate layer disposed on the second coupling layer and comprising the air pockets, wherein the intermediate layer includes a groove corresponding to an outer periphery of the sound generator, the sound generator having side surfaces and a lower surface received in and abutting the groove.

The porous layer comprises: a first coupling layer defining a first hole corresponding to an outer periphery of the sound generator and coupled with a lower surface of the display panel, a second coupling layer attached to an upper surface of the frame, an intermediate layer interposed between the first and second coupling layers and defining a second hole overlapping with the first hole, and a fourth coupling layer connecting the sound generator with the second coupling layer.

The porous layer may include: a first coupling layer coupled with a lower surface of the display panel, a second coupling layer attached to an upper surface of the frame, an intermediate layer interposed between and coupled to the first coupling layer and the second coupling layer and includes the air pockets, and a hole in the first coupling layer, the second coupling layer and the intermediate layer, the hole overlapping the sound generator, and wherein a lower surface of the sound generator abuts an upper surface of the frame through the hole.

The frame may define a hole spaced away from the sound generator in a thickness direction, and wherein the porous layer has a substantially uniform thickness extending from one side surface of the sound generator to the hole.

The porous layer may be disposed in a shortest path from one surface of the hole to the sound generator, and wherein a length of one side of the porous layer is equal to a length of the one surface of the hole.

The display device may further include: a heat reactive layer disposed between the display panel and the frame, wherein the heat reactive layer is spaced apart from the porous layer in a thickness direction.

According to another aspect of the invention, a display device includes: a display panel; a sound generator disposed under the display panel; a frame disposed under the display panel and the sound generator; and a porous layer disposed adjacent to the sound generator between the display panel and the frame and having a plurality of staggered air pockets partially overlapping one another along a shortest path between the display panel and the frame, wherein the display panel may be vibratable independently of the frame.

According to another aspect of the invention, a method of playing sound from an electronic device having a display panel and a sound generator mounted in a frame by a porous layer, the method includes the steps of: applying an electronic signal to activate the sound generator; and vibrating substantially the entire display panel via the porous layer.

The method may further include the step of: vibrating the display panel independently of the frame.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
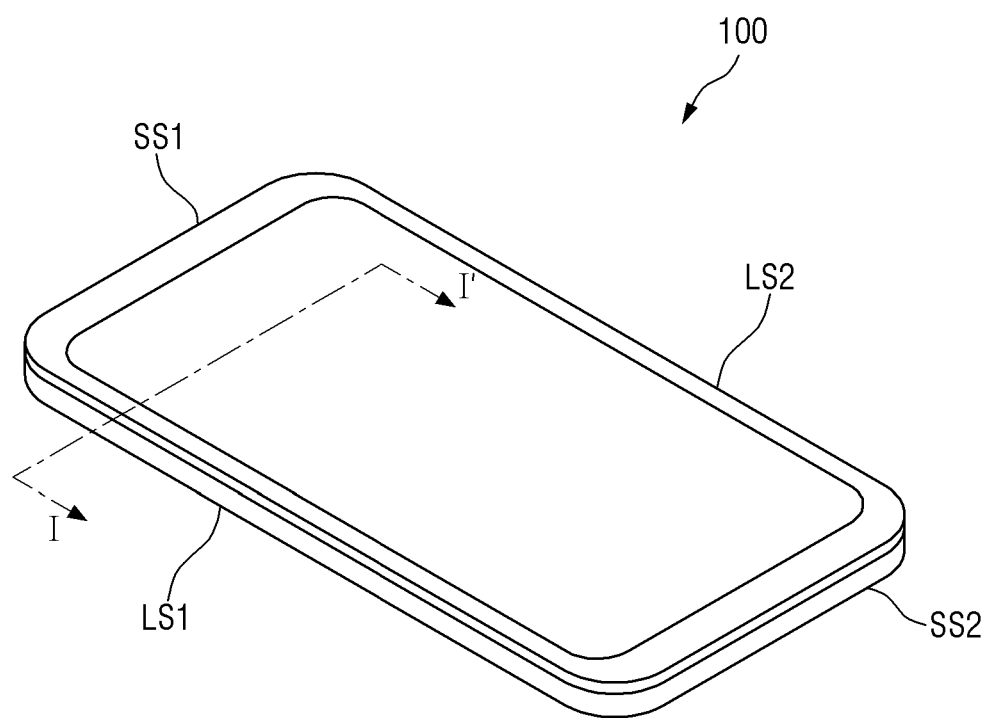
FIG. 1 is a perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
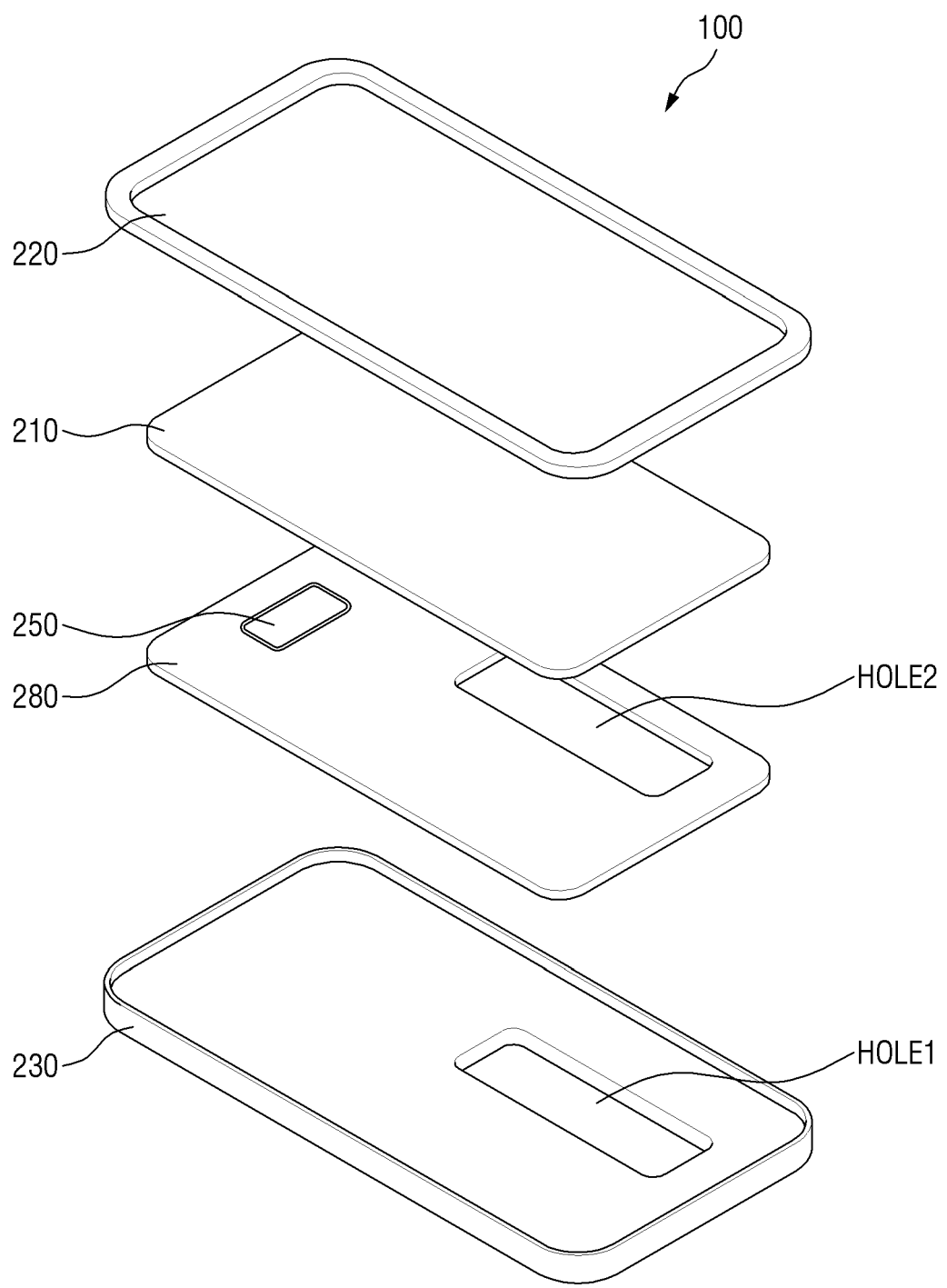
FIG. 2 is an exploded, perspective view of the display device of FIG. 1.
Figure 3:
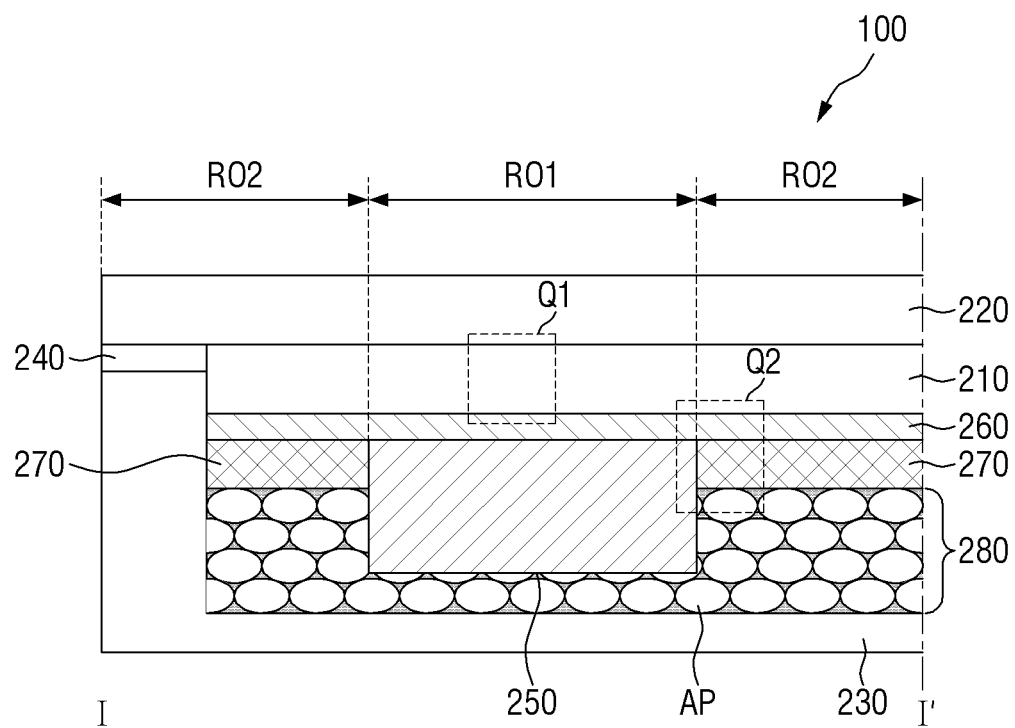
FIG. 3 is a cross-sectional view taken along line I-I' of FIG. 1.

FIG. 1 is a perspective view of a display device constructed according to an exemplary embodiment of the invention. FIG. 2 is an exploded, perspective view of a display device constructed according to an exemplary embodiment of the invention. FIG. 3 is a cross-sectional view taken along line I-I' of FIG. 1.

A display device is an output device for presentation of data in the form of image or video. For example, display devices may find applications in a smart phone, a tablet PC, a personal digital assistant (PDA), a portable multimedia player (PMP), a game device, a wearable electronic device such as a wristwatch, a personal computer, a laptop computer, a navigation device for vehicles, a digital camera, a television, an electronic billboard, etc.

Referring to FIGS. 1 to 3, a display device 100 may include a display panel 210, a frame (or a bracket) 230, a sound generator 250, and a porous layer 280. The display device 100 may further include a window 220, a coupling layer 240, a light-blocking layer 260, and a shock-absorbing layer 270.

As used herein, "top" and "upper surface" refers to the side of the display panel 210 in which images are displayed, whereas "bottom" and "lower surface" refers to the opposite side of the display panel 210, unless stated otherwise.

The display device 100 may have a generally rectangular shape when viewed in plan. The display device 100 may include first and second longer sides LS1 and LS2 and first and second shorter sides SS1 and SS2. The corners of the display device 100 (i.e., the portions where the first and second longer sides LS1 and LS2 meet with the first and second shorter sides SS1 and SS2) may be, but are not limited to being, rounded. For example, the display device 100 may have corners at the right angle or corners in any of a variety of shapes.

The display panel 210 is where the screen is disposed. For example, the display panel 210 may be an organic light-emitting display panel. In the following description, an organic light-emitting display panel is employed as the display panel 210. It is, however, to be understood that other types of display panels such as a liquid-crystal display panel, an electrophoretic display panel and plasma display panel may also be employed.

The display panel 210 may include a plurality of organic light-emitting elements disposed on a substrate. The substrate may be a rigid substrate made of glass or the like, or a flexible substrate made of polyimide or the like. When the polyimide substrate is used as the substrate, the display panel 210 may be curved, bent, folded or rolled. The display panel 210 may include a display part and a non-display part disposed around the display part. The organic light-emitting elements are disposed in the display part, and the circuits that provide signals necessary for driving the organic light-emitting elements may be disposed in the non-display part.

The window 220 may be disposed above the display panel 210. The window 220 may overlap with the display panel 210 and may cover the upper surface (or a display surface or front surface) of the display panel 210. The window 220 may be larger than the display panel 210 (i.e., may have a large area). For example, the window 220 may protrude outward from the edges of the display panel 210. The protruding portion of the window 220 (i.e., the edge portion of the window 220 protruding from the edges of the display panel 210) may be supported by the frame 230.

A transparent coupling layer 240 may be interposed between the window 220 and the display panel 210, and the window 220 may be coupled to the display panel 210 through the transparent coupling layer. The transparent coupling layer may be an optically clear adhesive (OCA) or an optically clear resin (OCR).

The window 220 may include a shielding pattern (or decorative pattern) located on the edge. The shielding pattern overlaps with the non-display part of the display panel 210, thereby preventing the non-display part from being seen by a viewer.

Although the window 220 is shown as being disposed directly on the display panel 210 in FIGS. 2 and 3, the invention is not limited thereto. For example, an upper functional module may be disposed between the display panel 210 and the window 220. The upper functional module may include at least one functional layer that performs a touch sensing feature, a color filtering feature, a color converting feature, a polarizing feature, a biometric information recognizing feature (for example, a fingerprint recognizing feature), etc. The functional layer may be a sheet layer made of a sheet, a film layer made of a film, a thin film layer, a coating layer, a panel, a plate, etc. A single functional layer may be made up of a single layer or a plurality of thin films or coating layers stacked on one another. For example, the functional layer may be a touch sensing panel, a color filter, an optical film, a fingerprint sensing panel, etc.

The frame 230 may be disposed below the display panel 210 (and below the window 220). The frame 230 may act as a container for accommodating other components or as a protective container. For example, the frame 230 may accommodate the display panel 210, the sound generator 250, and the porous layer 280.

The frame 230 may include a bottom (or a body) and side walls. The bottom of the frame 230 may have a generally plate-like shape and may be substantially parallel to the display panel 210. The side walls of the frame 230 may protrude upward from the edge of the bottom of the frame 230. The coupling layer 240 may be disposed on the side walls of the frame 230, and the frame 230 may be coupled to the window 220 by the coupling layer 240. The coupling layer 240 overlaps with the side walls of the frame 230 but not with the display panel 210. For example, the coupling layer 240 may be a pressure sensitive adhesive (PSA), a black tape, and a waterproof tape.

The frame 230 may further include a first hole HOLE1. The first hole HOLE1 may pass through the bottom of the frame 230 in the thickness direction. The first hole HOLE1 may be formed at the center area of the bottom of the frame 230. A battery device (not shown) of the display device 100 may be mounted in the first hole HOLE1. The porous layer 280 to be described later may include a second hole HOLE2 corresponding to the shape of the first hole HOLE1.

The sound generator 250, the shielding layer 260, the shock-absorbing layer 270, and the porous layer 280 may be disposed between the display panel 210 and the frame 230.

The shielding layer 260 may have substantially the same shape when viewed in plan and substantially the same size (or area) as the display panel 210 and may be disposed under the display panel 210. The shielding layer 260 may have a light transmittance lower than that of the window 220 and may block some light exiting downward from the display panel 210 and reflected.

The sound generator 250 may take the form of a speaker, vibrator, actuator or any other device that can generate vibration in response to an acoustic signal. For example, the sound generator 250 may be a piezoelectric element including a vibration material layer 430. The configuration of an exemplary sound generator 250 will be described later with reference to FIG. 4A.

The sound generator 250 may be disposed under the shielding layer 260 (or the display panel 210) and may be coupled to the shielding layer 260 (or the display panel 210). For example, the sound generator 250 may be coupled with the shielding layer 260 (or the display panel 210) through an adhesive layer, or a double-sided adhesive tape, etc. The vibration caused by the sound generator 250 is transmitted to the display panel 210, so that the entire display panel 210 can serve as a diaphragm.

Typically, a speaker with a larger diaphragm exhibits stronger sound pressure as the sound is output from the diaphragm and better output characteristic in the low-frequency range. When the display device 100 utilizes the display panel 210 as the diaphragm, no additional speaker is required, so that the size of the display device 100 can be reduced and the structure of the display device 100 can be simplified. Further, when the display panel 100 having a relatively large area is utilized as the diaphragm, the display device 100 can exhibit better acoustic and low-frequency output characteristics.

Although the sound generator 250 is shown as being coupled under the shielding layer 260 in FIGS. 2 and 3, this is merely illustrative. For example, the sound generator 250 may be in direct contact with the lower surface of the display panel 210. When the first electrode 410 of the sound generator 250 to be described later is in direct contact with the lower surface of the display panel 100, the sound generator 250 may be in contact with and coupled to the display panel 210.

The shock-absorbing layer 270 may be disposed under the shielding layer 260 (or the display panel 250).

The shock-absorbing layer 270 can prevent or mitigate the shock transmitted from the outside to the display panel 210 from the bottom. For example, the shock-absorbing layer 270 may be made of a material including polyurethane (PU), thermoplastic polyurethane (TPU), silicon (Si), poly dimethylacrylamide (PDMA), etc.

The shock-absorbing layer 270 has a shape and a size conforming to the display panel 210 and may overlap with the display panel 210 but not with the sound generator 250. That is to say, the shock-absorbing layer 270 may include a hole corresponding to the shape of the sound generator 250. The shock-absorbing layer 270 may be attached to the lower surface of the shielding layer 260 (or the display panel 250) through a pressure sensitive adhesive film or the like.

Although not shown in FIGS. 2 and 3, the display device 100 may include at least one lower functional module under the display panel 210. The lower functional module may perform a heat dissipation function, an electromagnetic wave blocking function, a grounding function, a strength enhancing function, a supporting function, a bonding function, a pressure sensing function, a digitizing function, etc. For example, the lower functional module may be a supporting substrate, a heat-dissipating layer, an electromagnetic wave blocking layer, a coupling layer, a pressure sensor, a digitizer, etc.

The porous layer 280 may be disposed on the frame 230. The porous layer 280 may be interposed between the shock-absorbing layer 270 and the frame 230. Further, the porous layer 280 may be interposed between the sound generator 250 and the frame 230.

The porous layer 280 may have a generally plate-like shape. The porous layer 280 includes a first overlap region RO1 and a second overlap region RO2. The first overlap region RO1 may overlap the sound generator 250, and the second overlap region RO2 may overlap the shock-absorbing layer 270. The thickness of the first overlap region RO1 may be different from that of the second overlap region RO2. For example, the thickness of the first overlap region RO1 may be smaller than the thickness of the second overlap region RO2. However, this is illustrative and the porous layer 280 is not limited thereto. For example, when the thickness of the sound generator 250 is relatively thin, the thickness of the first overlap region RO1 may be equal to or larger than the thickness of the second overlap region RO2.

The porous layer 280 may include a plurality of air pockets AP stacked on one another in the thickness direction. The air pockets AP may be staggered in the vertical direction (i.e., the direction perpendicular to the display surface of the display panel 210) and may be spatially interconnected. Specifically, the porous layer 280 includes a gel structure (or a network structure) generated when a material (or molecules) forming the porous layer 280 is synthesized. For example, the porous layer 280 may be an aerogel layer.

Since the material (or the structure) of the porous layer 280 is not be connected continuously on a particular vertical line VL (see, e.g., FIG. 5) or on any vertical line due to the air pockets AP, the upper and lower surfaces of the porous layer 280 may not be directly supported. Therefore, when a pressure is applied to a surface of the porous layer 280 entirely, the thickness of the porous layer 280 can be reduced entirely. That is to say, when the display panel 210 is vibrated by the sound generator 250, the display panel 210 can be entirely vibrated independently of the frame 230.

In addition, since the air pockets AP formed in the porous layer 280 are connected in the horizontal direction, they may connect a first space where the sound generator 250 is disposed (i.e., the space between the first overlap region RO1 of the porous layer 280 and the shielding layer 260) with a second space where a battery is mounted (i.e., the space formed under the shielding layer 260 by the first hole HOLE1 of the frame 230 and the second hole HOLE2 of the porous layer 280). In this case, the first and second spaces form a single resonance space, and the sound of the display device 100 can be amplified through the resonance space. As a result, the acoustic characteristics of the display device 100 can be improved.

As described above, the display device 100 includes the sound generator 250 attached to the lower surface of the display panel 210, and the entire display panel 210 can be used as a diaphragm. In particular, the display device 100 includes the porous layer 280 disposed between the display panel 210 and the frame 230. The porous layer 280 has the gel structure (or network structure) forming it and includes a plurality of air pockets AP formed in the gel structure (i.e., the air pockets alternately stacked on one another in the vertical direction and interconnected). Therefore, the display panel 210 can vibrate entirely independently of the frame 230. In addition, the porous layer 280 connects the first space where the sound generator 250 is disposed with the second space where a battery is mounted, so that the first and second spaces form a resonance space, thereby improving acoustic characteristics of the display device 100.

Figure 4A:
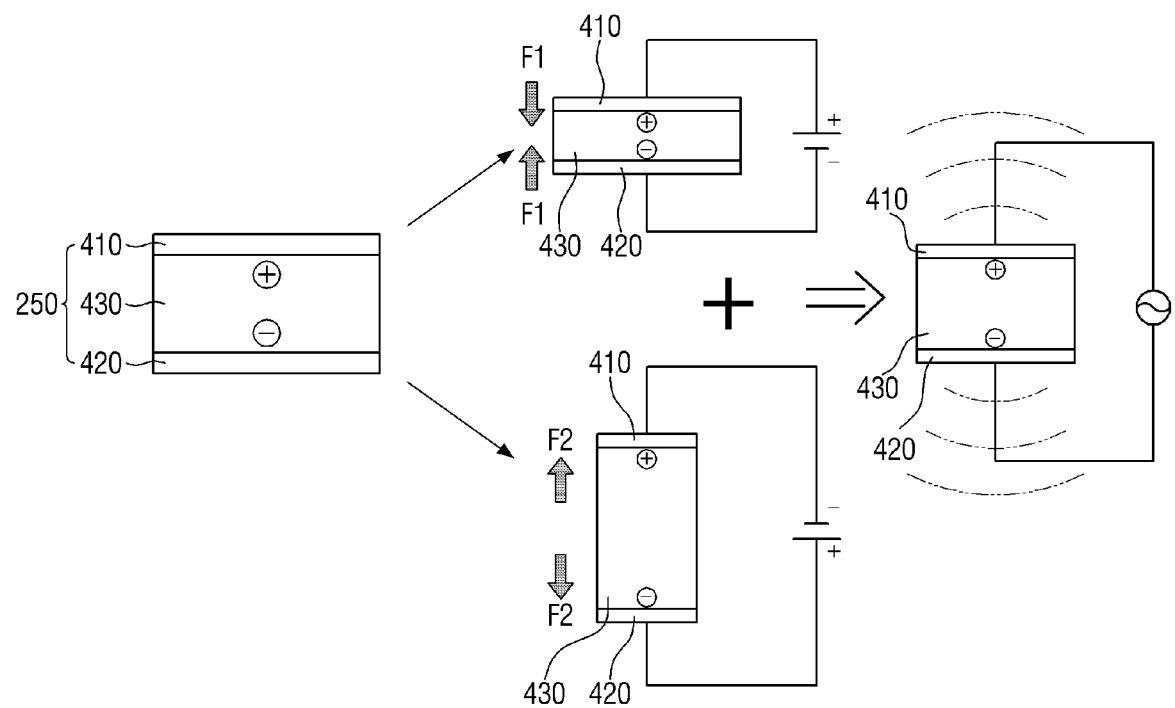
FIG. 4A is a schematic diagram illustrating operational characteristics of a vibration acoustic device constructed according to an exemplary embodiment of the invention.

FIG. 4A is a schematic diagram illustrating operational characteristics of a vibration acoustic device constructed according to an exemplary embodiment of the invention.

Referring to FIG. 4A, the sound generator 250 may include a first electrode 410, a second electrode 420, and a vibration material layer 430. The second electrode 420 faces the first electrode 410. The vibration material layer 430 may be interposed between the first electrode 410 and the second electrode 420.

The first electrode 410 and the second electrode 420 may be made of a conductive material. For example, the first electrode 410 and the second electrode 420 may include a transparent conductor such as ITO or IZO, an opaque metal, a conductive polymer, or a carbon nanotube (CNT).

The vibration material layer 430 may include a piezoelectric material that vibrates by an electric field. For example, the vibration material layer 430 may include at least one of a piezoelectric such as lead zirconate titanate (PZT), a piezoelectric film such as a polyvinylidene fluoride (PVDF) film and an electro active polymer.

The vibration material layer 430 may be compressed or relaxed depending on the polarity of the voltage applied thereto. For example, as shown in FIG. 4A, when a positive voltage is applied to the first electrode 410 and a negative voltage is applied to the second electrode 420, a compressive force F1 may be created in the vibration material layer 430 so that it may contract in the thickness direction. On the other hand, when a negative voltage is applied to the first electrode 410 and a positive voltage is applied to the second electrode 420, a relaxation force F2 is created in the vibration material layer 430 so that it may expand in the thickness direction. Accordingly, when an alternating voltage (that is, a voltage with alternating polarities) is applied to the first electrode 410 and the second electrode 420, the vibration material layer 430 may repeatedly contract and expand. As the vibration material layer repeatedly contract and expand, vibration may occur in the display panel 210 in contact with the sound generator 250. The display panel 210 itself can serve as the diaphragm of the speaker. That is to say, sound can be generated as the vibration of the display panel 210 changes the pressure of the air. When the display panel 210 is an organic light-emitting display panel, sound can be generated without screen distortion due to vibration.

Although the sound generator 250 is shown as including a piezoelectric element in FIG. 4A, this is merely illustrative and the sound generator 250 is not limited thereto as noted above. For example, the sound generator 250 may be formed from a permanent magnet and a coil winding the permanent magnet. Accordingly, when a current corresponding to an acoustic signal flows in the coil, vibration may be generated by electromagnetic force.

Figure 4B:
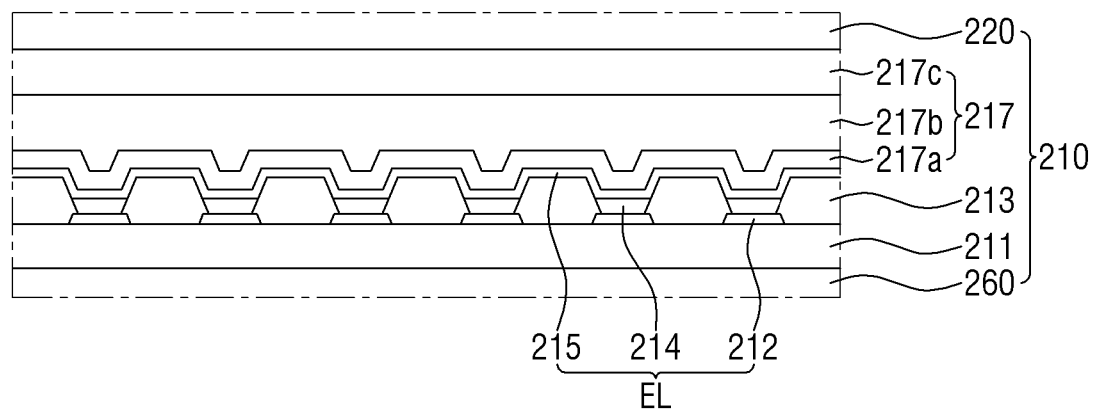
FIG. 4B is an enlarged view of area Q1 of FIG. 3.

FIG. 4B is an enlarged view of area Q1 of FIG. 3. FIG. 4B shows the configuration of the display panel 210 in detail.

Referring to FIG. 4B, the display panel 210 may include a base substrate 211, a first electrode 212, a pixel-defining layer 213, an emissive layer 214, a second electrode 215, and an encapsulation layer 217.

The base substrate 211 may be disposed on the shielding layer 260. The base substrate 211 may be an insulating substrate. In an exemplary embodiment, the base substrate 211 may include a flexible polymer material. The polymer material may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

The first electrode 212 may be disposed on the base substrate 211. In some exemplary embodiments, the first electrode 212 may be an anode electrode.

A plurality of elements may be further disposed between the base substrate 211 and the first electrode 212. For example, the elements may include a buffer layer, a plurality of conductive wirings, an insulating layer, a plurality of thin-film transistors, etc.

The pixel defining layer 213 may be disposed on the first electrode 212. The isolation 213 includes openings each exposing at least a part of the respective first electrodes 212.

The emission layer 214 may be disposed on the first electrode 212.

In some exemplary embodiments, the emission layer 214 may emit one of red light, green light, and blue light. The wavelength of the red light may range from approximately 620 to 750 nm, and the wavelength of the green light may range from approximately 495 to 217 nm. Further, the wavelength of the blue light may range from approximately 450 to 495 nm.

Alternatively, according to another exemplary embodiment of the invention, the emissive layer 214 may emit white light. When the emissive layer 214 emits white light, the emissive layer 214 may have a stack structure of a red emissive layer, a green emissive layer and a blue emissive layer. In addition, additional color filters for displaying red, green and blue colors, respectively, may be further included.

In some exemplary embodiments, the emissive layer 214 may be an organic emissive layer. Alternatively, according to another exemplary embodiment of the invention, the emissive layer 214 may be a quantum-dot emissive layer.

The second electrode 215 may be disposed on the emissive layer 214 and the pixel defining layer 213. For example, the second electrode 215 may be disposed entirely on the emissive layer 214 and the pixel-defining layer 213. In some exemplary embodiments, the second electrode 215 may be a cathode electrode.

The first electrode 212, the second electrode 215 and the emissive layer 214 may form a self-luminous element EL.

The encapsulation layer 217 may be disposed on the self-luminous element EL. The encapsulation layer 217 can seal the self-luminous element EL and prevent moisture or the like from permeating into the self-luminous element EL from the outside.

In some exemplary embodiments, the encapsulant layer 217 may be formed of a thin-film encapsulation and may include one or more organic films and one or more inorganic films. For example, the encapsulation layer 217 may include a first inorganic layer 217a disposed on the second electrode 215, an organic layer 217b disposed on the first inorganic layer 217, and a second inorganic layer 217c disposed on the organic layer 217b.

The first inorganic layer 217a can prevent moisture, oxygen and the like from permeating into the self-luminous element EL. The first inorganic layer 217a may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), etc.

The organic layer 217b may be disposed on the first inorganic layer 217a. The organic layer 217b can improve the degree of flatness. The organic layer 217b may be formed of a liquid organic material and may be formed of an acrylic resin, a methacrylic resin, polyisoprene, a vinyl resin, an epoxy resin, an urethane resin, a cellulose resin, a perylene resin, etc. Such organic material may be provided on the base substrate 211 through deposition, printing and coating and may be subjected to a curing process.

The second inorganic layer 217c may be disposed on the organic layer 217b. The second inorganic layer 217c may perform substantially the same as or similar function with the first inorganic layer 217a and may be made of a material substantially the same as or similar to the first inorganic layer 217a. The second inorganic layer 217c may completely cover the organic layer 217b. In some exemplary embodiments, the second inorganic layer 217c and the first inorganic layer 217a may come in contact with each other in the non-display area NDA to form an inorganic-inorganic junction.

However, the structure of the encapsulation layer 217 is not limited thereto but may vary depending on implementations. Alternatively, in another exemplary embodiment, the encapsulation layer 217 may be formed of a glass substrate or the like.

Figure 4C:
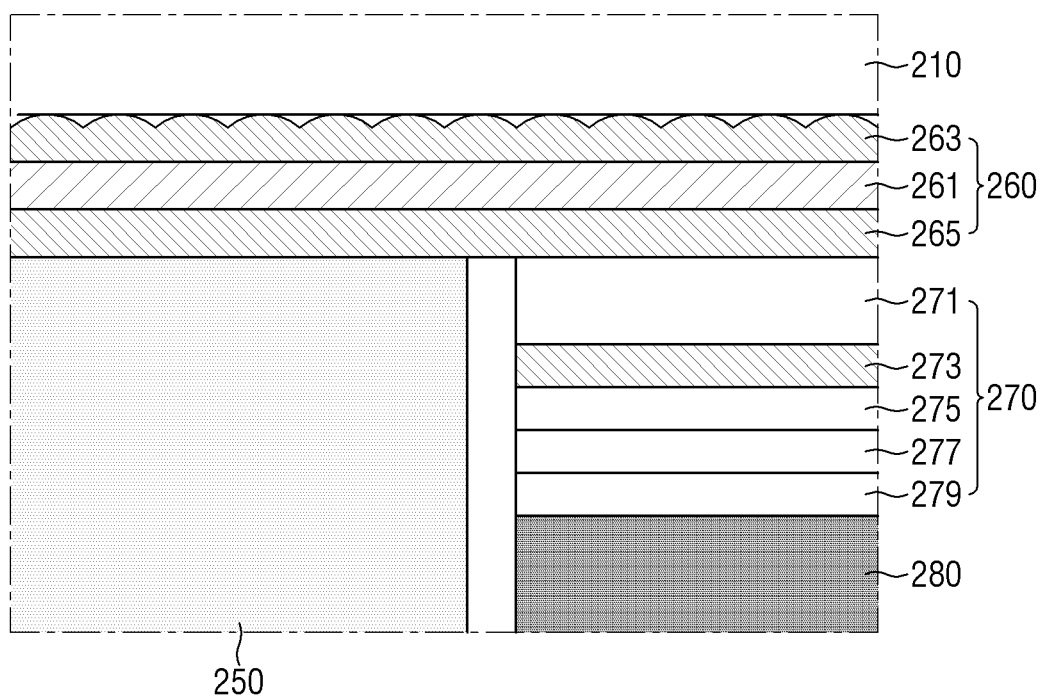
FIG. 4C is an enlarged view of area Q2 of FIG. 3.

FIG. 4C is an enlarged view of area Q2 of FIG. 3. FIG. 4C shows the shielding layer 260 and the shock-absorbing layer 270 in detail.

Referring to FIG. 4C, the shielding layer 260 includes a light-absorbing member 261 disposed under the display panel 210, a top coupling layer 263 positioned between the light-absorbing member 261 and the display panel 210, and a first interlayer coupling layer 265 located under the light-absorbing member 261.

The light absorbing member 261 blocks transmission of light to thereby prevent the acoustic device 250 thereunder and the like from being seen from the top. The light-absorbing member 261 may include a base and a light-absorbing material such as a black pigment or a dye disposed on a surface of the base. For example, the light-absorbing member 261 may include black ink. The light-absorbing member 263 may be formed by coating or printing black ink on the upper surface of the base.

The top coupling layer 263 may be used to attach the light-absorbing member 261 under the display panel 210. The top coupling layer 263 may include an embossing pattern such as a concave pattern depressed from the upper surface or a convex pattern protruding from the upper surface. When the acoustic device 250 is coupled to the shielding layer 260 to form a single panel support member, a relatively large number of bubbles may be generated during the process of attaching the panel support member including the rigid acoustic element 250 to the display panel 210 (e.g., the rigid display panel), as compared with the case where a flexible panel support member is attached to the display panel 210. In view of the above, the top coupling layer 263 has an embossing pattern, so that the bubbles may be discharged to the outside. The embossing pattern may collapse after the shielding layer 260 is coupled to the display panel 210. It is, however, to be understood that the invention is not limited thereto. For example, the embossing pattern may remain even after the shielding layer 260 is coupled to the display panel 210, so that the remaining bubbles may be discharged to the outside.

The top coupling layer 263 may include an adhesive layer or a resin layer. For example, the top coupling layer 263 may contain a polymer material that is sorted into a silicone polymer, a urethane polymer, an SU polymer having silicone-urethane hybrid structure, an acrylic polymer, an isocyanate polymer, a polyvinyl alcohol polymer, a gelatin polymer, a vinyl polymer, a latex polymer, polyester polymer, water-based polyester polymer, etc.

The first interlayer coupling layer 265 may couple the acoustic element 250 and the shock-absorbing layer 270 to the light-absorbing member 261. The first interlayer coupling layer 265 may include a material selected from among the above-listed materials of the top coupling layer 263.

The shock-absorbing layer 270 may further include a buffer member 271 disposed under the shielding layer 260, a second interlayer coupling layer 273 disposed under the buffer member 271, and a heat-dissipating member disposed under the second interlayer coupling layer 273.

The buffer member 271 absorbs an external shock to thereby prevent the display panel 210, the window 220 and the like from being damaged. The buffer member 271 may be made up of a single layer or a stack of multiple layers. For example, the buffer member 271 may be formed of a polymer resin or an elastic material such as a rubber, and a sponge formed by foaming a urethane-based material or an acrylic-based material. The buffer member 271 may be a cushion layer.

The heat-dissipating member may be disposed under the buffer member 271. The heat-dissipating member 730 may include at least one heat-dissipating layer. FIG. 4C illustrates an example where the heat-dissipating member includes two heat-dissipating layers 275 and 277.

The first heat-dissipating layer 275 and the second heat-dissipating layer 277 may be made of the same material or may be made of materials having different heat-dissipating properties. For example, the first heat-dissipating layer 275 may include graphite, carbon nanotubes, or the like. The second heat-dissipating layer 277 may include various materials capable of blocking electromagnetic waves and having excellent thermal conductivity. For example, the second heat-dissipating layer 277 may include a thin metal film such as copper, nickel, ferrite and silver.

The second heat-dissipating layer 277 may be disposed under the first heat-dissipating layer 275. In some exemplary embodiments, the first heat-dissipating layer 275 may overlap the second heat-dissipating layer 277, and the first heat-dissipating layer 275 may be smaller than the second heat-dissipating layer 277 such that the side surfaces of the former may be located more to the inside than those of the latter.

A coupling layer may be disposed between the first heat-dissipating layer 275 and the second heat-dissipating layer 277. The coupling layer may couple the first heat-dissipating layer 275 with the second heat-dissipating layer 277 and may completely cover the first heat-dissipating layer 275. The material of the coupling layer may be selected from among the above-listed materials of the top coupling layer 263.

A bottom coupling member 279 may be disposed under the heat-dissipating member. The bottom coupling member 279 may couple the porous layer 280 with the shock-absorbing layer 270. The bottom coupling member 279 may be in the form of a tape having two coupling layers on its two sides, e.g., a double-sided adhesive tape. For example, the bottom coupling member may include a heat-sensitive material that is resistant to vibration and heat generated during operation of the acoustic device 250.

Figure 5:
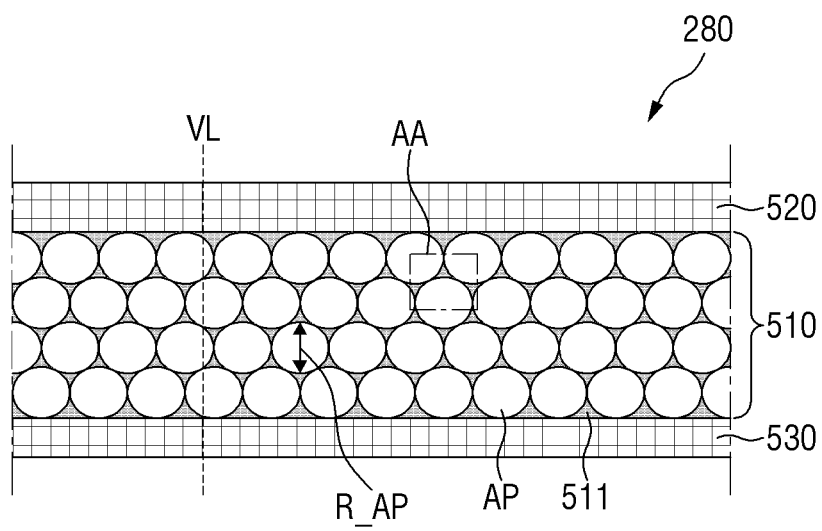
FIG. 5 is a cross-sectional view of a porous layer constructed according to an exemplary embodiment of the invention.
Figure 6:
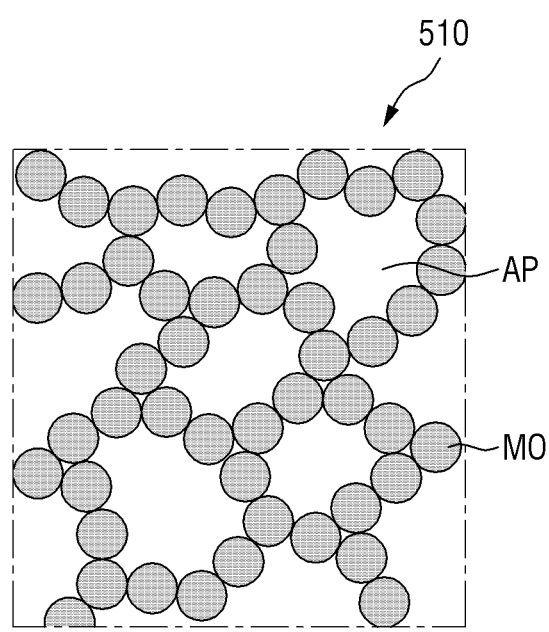
FIG. 6 is an enlarged view of area AA of FIG. 5.

FIG. 5 is a cross-sectional view of a porous layer constructed according to an exemplary embodiment of the invention. FIG. 6 is an enlarged view of area AA of FIG. 5.

Referring to FIGS. 5 and 6, a porous layer 280 may include an intermediate layer 510, a first coupling layer 520, and a second coupling layer 530.

The intermediate layer 510 may include air pockets AP, as described above. For example, the intermediate layer 510 may be made of silicon dioxide ($SiO_2$) MO (or silica), and as shown in FIG. 6, silicon dioxide molecules MO may be bonded with one another with a three-dimensional network structure. That is to say, the intermediate layer 510 may be silica aerogel.

The silica aerogel may be prepared via a process of preparing silica gel, an alignment process and a drying process. In the process of preparing silica gel, the silica gel may be produced by a sol-gel synthesis technique. A gel may be obtained by adding a catalyst to a solution of silica as the main material and performing a gelation process. Subsequently, in the alignment process, the silica gel may be immersed in a mixture of an alkoxysilane and a solvent to undergo an alignment process. By doing so, the strength of the gel can be increased. Subsequently, in the drying process, the gel 511 can be separated from the liquid in the air pockets AP.

The intermediate layer 510 may have a porosity of about 90% or more (i.e., a ratio of air pockets AP to the total volume), and further, a porosity of 98% or more.

Thus, as described above with reference to FIGS. 1 to 3, the air pockets AP are generally interconnected and a fluid (e.g., air) may flow in the intermediate layer 510 through the air pockets AP.

The air pockets AP formed in the intermediate layer 510 may have a size of about 50 nm or less (or about 50 nm to about 20 nm), and further, an average size R_AP (or diameter) of 20 nm. If the liquid is water, the water may not penetrate into the intermediate layer 510 (and the porous layer 280) because the surface area is greater than 50 nm. That is to say, depending on the size of the air pockets AP, the intermediate layer 510 (and the porous layer 280) may have enhanced waterproofing properties.

In addition, when the intermediate layer 510 is silica aerogel, the silica aerogel may have hydrophobicity by supercritically drying the silica aerogel during the drying process. Silanol (Si—OH) polarity portion, which is the basic structure of silica aerogel, is hydrophilic. However, during the supercritical drying process, the hydroxyl group (—OH) (or the hydroxy group) reacts with the solvent to change into a methoxy group (—OCH$_3$)x) (or methoxy group). Therefore, the silica aerogel can have hydrophobicity.

The intermediate layer 510 includes the air pockets AP and thus can have a relatively excellent heat insulating property. Although heat can be transferred as air passes through the air pockets AP, the silica aerogel has a low heat transfer coefficient and thus can suppress heat transfer by radiation at a low temperature. Therefore, it is possible to prevent or suppress the heat from the frame 230 from being transferred to the display panel 210.

The modulus of the intermediate layer 510 may be about 0.5 MPa or less, or about 0.5 MPa to about 0.05 MPa. The modulus of the intermediate layer 510 may refer to Young's modulus. The lower the modulus of the intermediate layer 510 is, the more freely the display panel 210 can vibrate independently of the frame 230.

The first coupling layer 520 may be disposed on the intermediate layer 510, and the second coupling layer 530 may be disposed under the intermediate layer 520. That is to say, the intermediate layer 510 may be interposed between the first coupling layer 520 and the second coupling layer 530.

The first coupling layer 520 may have two adhesive surfaces and may be, for example, an acryl adhesive. The first coupling layer 520 may be attached to the upper surface of the intermediate layer 510 via a lamination process, and then the porous layer 280 may be coupled with the shielding layer 270 (and/or the sound generator 250 and/or the display panel 210).

The second coupling layer 540 may have two adhesive surfaces and may be, for example, an acryl adhesive, similarly to the first coupling layer 520. The second coupling layer 530 may be attached to the lower surface of the intermediate layer 510 and then the porous layer 280 may be coupled with the frame 230. In addition, the second coupling layer 530 may further include a heat reactive material such as aminopolast. The second coupling layer 530 can remove or mitigate friction/impact continuously generated between the frame 230 and the intermediate layer 510 and noise due to such friction/impact (i.e., noise to sound) when the display panel 210 vibrates.

It is to be noted that the porous layer 280 may have a thickness of 100 μm or less.

As described above with reference to FIGS. 5 and 6, the porous layer 280 includes the intermediate layer 510 and the first and second coupling layers 520 and 530, wherein the intermediate layer 510 has a three-dimensional network structure of silica, has a porosity of about 90% or more, and has the modulus of about 0.5 MPa or less. Therefore, the display panel 210 vibrates freely independently of the frame 230, and the first space where the sound generator 250 is disposed and the second space where a battery is mounted together form a sing resonance space, so that the acoustic characteristics of the display device 100 can be improved. Further, the porous layer 280 has hydrophobicity, so that the display panel 210 can be protected from moisture penetrating from the outside (in particular, from below).

FIGS. 7 to 20 are cross-sectional views of display devices constructed according to a variety of exemplary embodiments of the invention.

The sound pressure (or sound level) may vary depending on the thickness of the sound generator 750 and the thickness of the diaphragm (i.e., the display panel 210 and the elements coupled thereto). Depending on the required sound pressure, the thickness of the sound generator 750 may be increased or decreased. Further, the thickness of the diaphragm may be increased or decreased with respect to the sound generator 750.

Figure 7:
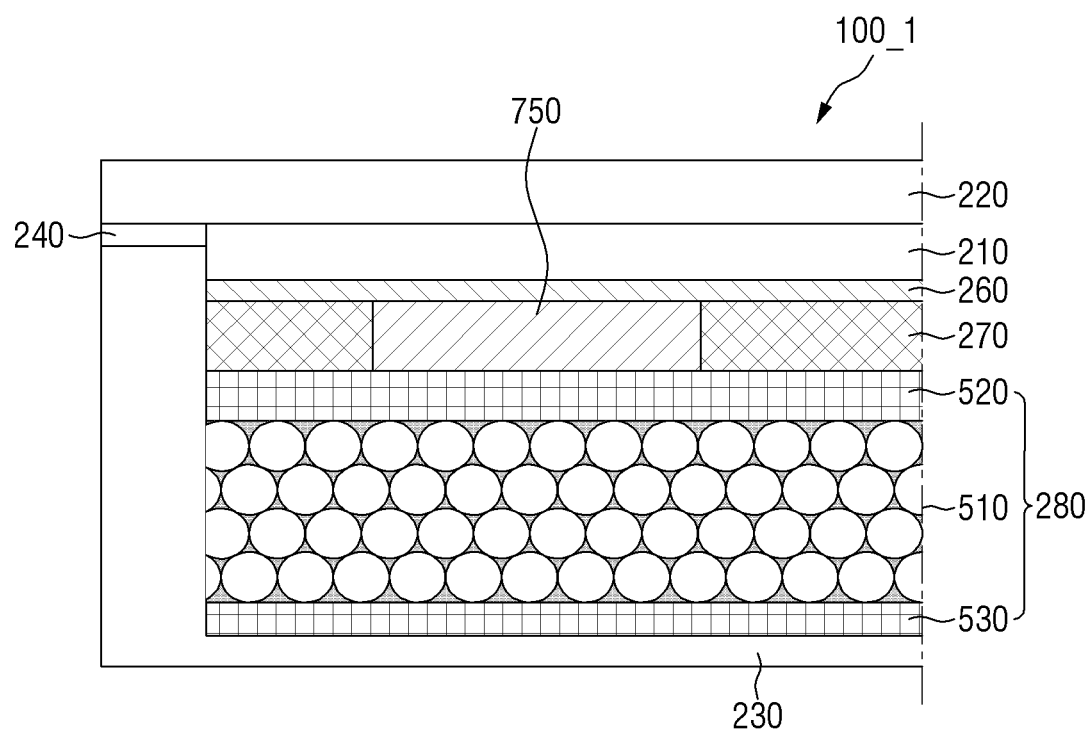
FIGS. 7, 8, 9, 10, 11, 12, 13, 14, 15, 16, 17, 18, 19, and 20 are cross-sectional views of display devices constructed according to a variety of exemplary embodiments of the invention.

Initially, referring to FIG. 7, a display device 100_1 is different from the display device 100 of FIG. 3 in that the former includes a sound generator 750.

The sound generator 750 may be substantially identical to the sound generator 250 described above with reference to FIG. 3 except for the thickness; and, therefore, the redundant description will be omitted.

The sound generator 750 may have the thickness equal to that of the shock-absorbing layer 270. The lower surface of the sound generator 750 and the lower surface of the shock-absorbing layer 270 may be located on the same plane.

The thickness of the porous layer 280 in the first overlap region RO1 (i.e., the first region overlapping the sound generator 750) may be equal to the thickness in the second overlap region RO2 (i.e., the second overlap region RO2 overlapping the shock-absorbing layer 270).

Therefore, the porous layer 280 may include the intermediate layer 510 and the first and second coupling layers 520 and 530 described above with reference to FIG. 5 throughout the first and second regions RO1 and RO2.

The porous layer 280 may connect the shock-absorbing layer 270 (or the display panel 210) and the sound generator 250 to the frame 230, thereby preventing direct friction and impact between the sound generator 250 and the frame 230. As a result, the durability of the display device 100_1 can be improved.

Figure 8:
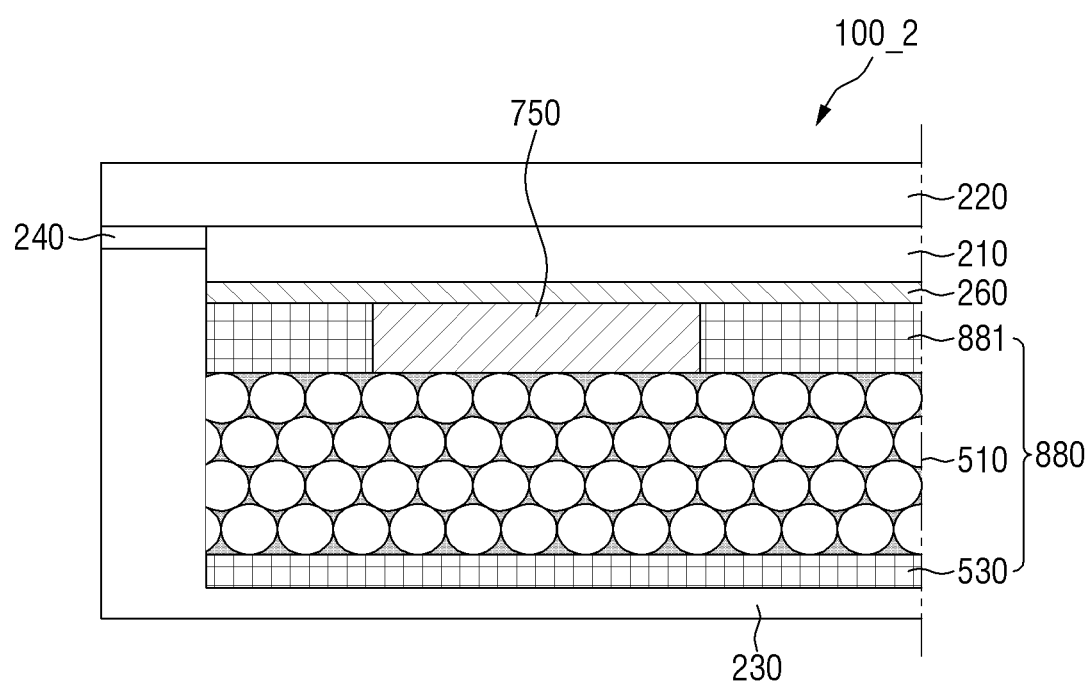

Referring to FIG. 8, a display device 100_2 is different from the display device 100 of FIG. 3 in that the former includes a porous layer 880.

The porous layer 880 may include an intermediate layer 510, a first coupling layer 811 and a second coupling layer 530. The first coupling layer 811 may be substantially identical to the first coupling layer 520 described above with reference to FIG. 5.

The first coupling layer 811 may overlap with the second overlap region RO2 but not with the first overlap region RO1. That is to say, the first coupling layer 811 may include a hole corresponding to the shape of the sound generator 750 (or the first overlap region RO1), and the first coupling layer 811 may be attached to the lower surface of the shielding layer 260, similarly to the shock-absorbing layer 270. That is to say, the first coupling layer 811 may be disposed in place of the shock-absorbing layer 270 described with reference to FIG. 3.

In this case, the overall thickness of the display device 100_2 can be decreased.

Figure 9:
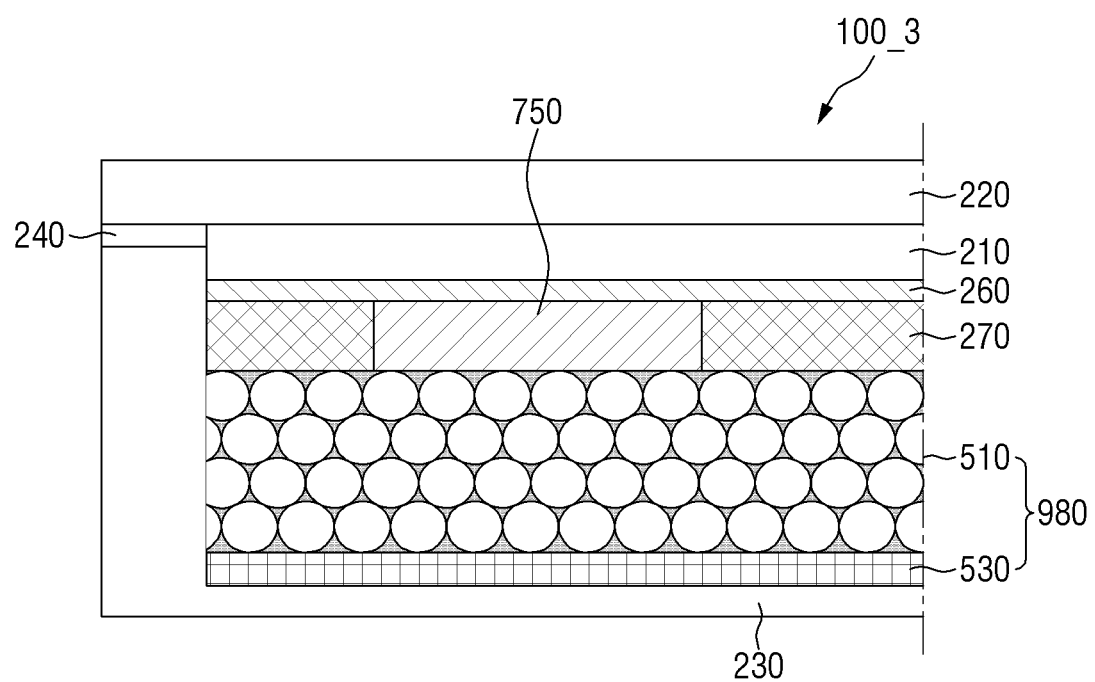

Referring to FIG. 9, a display device 100_3 is different from the display device 100 of FIG. 3 (and the display device 100_2 of FIG. 8) in that the former includes a porous layer 980.

The porous layer 980 includes an intermediate layer 510 and a second coupling layer 530 and may not include the first coupling layer 520 described above with reference to FIG. 5.

The porous layer 980 is completely separated from the sound generator 750 and the shock-absorbing layer 270, and the display panel 210 forms a diaphragm having a relatively small thickness and can vibrate more freely.

Figure 10:
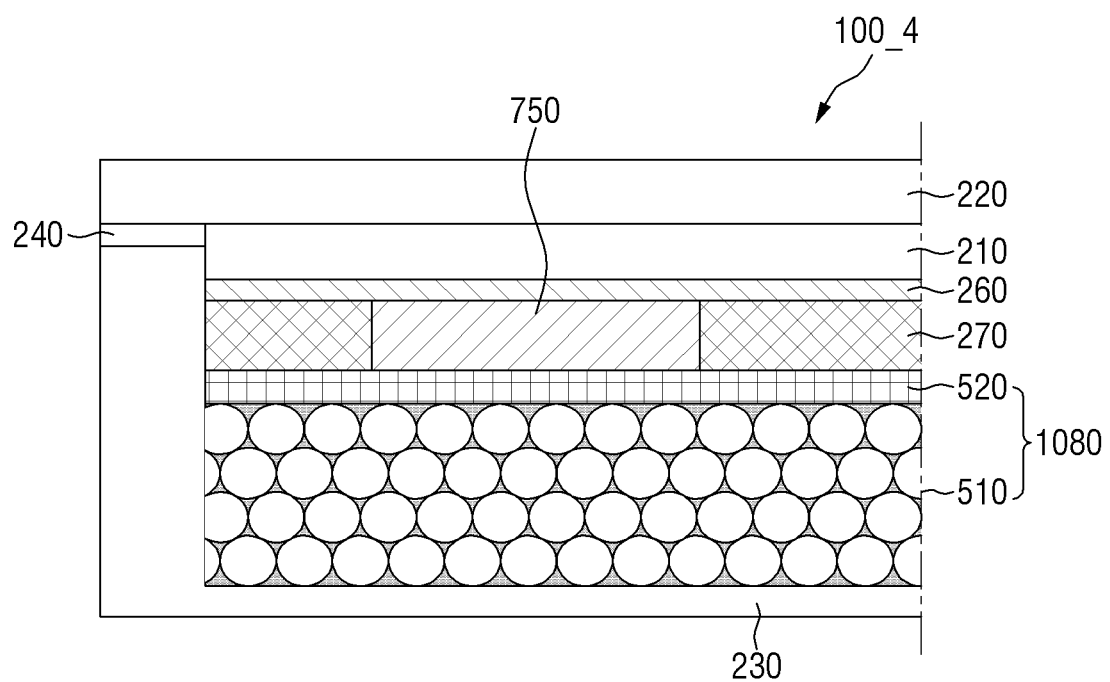

Referring to FIG. 10, a display device 100_4 is different from the display device 100 of FIG. 3 in that the former includes a porous layer 1080.

The porous layer 1080 may include an intermediate layer 510 and a first coupling layer 520 and may not include the second coupling layer 530 described above with reference to FIG. 5.

The porous layer 980 is separated from the frame 230, and the display panel 210 forms a diaphragm having a relatively large thickness, and can vibrate more freely, similarly to the display device 100_3 of FIG. 9.

Further, because friction and impact are generated between the lower surface of the porous layer 980 and the upper surface of the frame 230 as the display panel 210 vibrates, and it is thus possible in this embodiment to prevent direct friction and impact to the sound generator 750.

Figure 11:
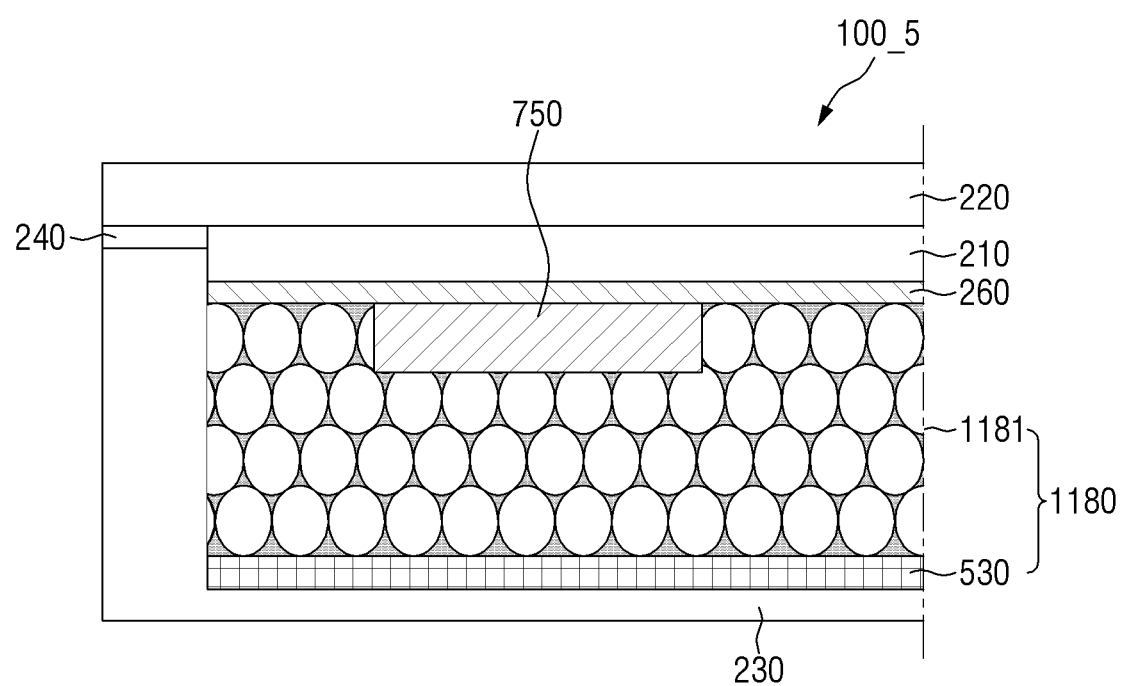

Referring to FIG. 11, a display device 100_5 is different from the display device 100 of FIG. 3 (and the display device 100_3 of FIG. 9) in that the former includes a porous layer 1180.

A porous layer 1180 may include an intermediate layer 1181 and a second coupling layer 530. The intermediate layer 1181 may be substantially identical to the intermediate layer 510 described above with reference to FIG. 5.

The thickness of the intermediate layer 1181 in the first overlap region RO1 may be smaller than that in the second overlap region RO2, similarly to the porous layer 1180 described above with reference to FIG. 3. The intermediate layer 1181 may include a groove (or a recess) formed in the upper surface thereof corresponding to the shape of the sound generator 750 (or the first overlap region RO1). When the display panel 210 vibrates, the shielding layer 270 and the intermediate layer 1181 are spaced apart from each other, and the display panel 210 forms a thinner diaphragm and can vibrate more freely.

Figure 12:
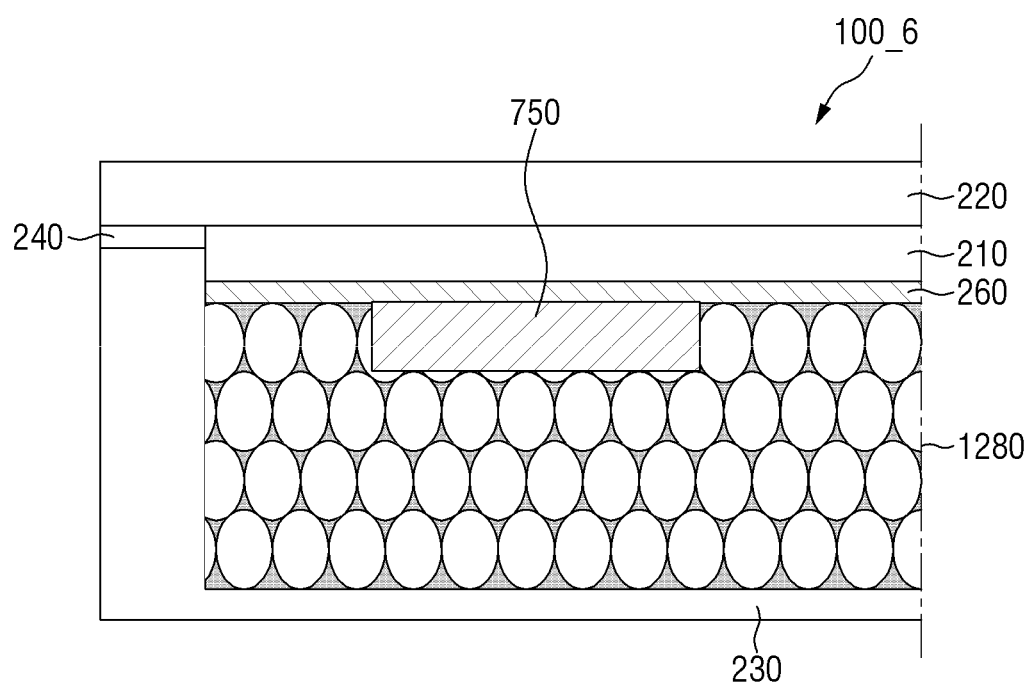

Referring to FIG. 12, a display device 100_6 is different from the display device 100 of FIG. 3 (and the display device 100_3 of FIG. 11) in that the former includes a porous layer 1280.

The porous layer 1280 may be substantially identical to the intermediate layer 1181 described above with reference to FIG. 11 and may not include the first and second coupling layers 520 and 530.

Accordingly, the thickness of the display device 100_6 can be further decreased. The porous layer 1280 is separated from the shielding layer 270 (or the display panel 210), the sound generator 750 and the frame 230. Therefore, when the display panel 210 vibrates, the upper surface of the porous layer 1280 may be separated from the display panel 210, the lower surface of the porous layer 1280 may be separated from the frame 230, and the porous layer 1280 may be dislocated. However, by reducing the vibration range (or vibration height or vibration width) of the display panel 210 or by relatively increasing the thickness of the sound generator 750, it is possible to prevent the dislocation of the porous layer 1280.

Figure 13:
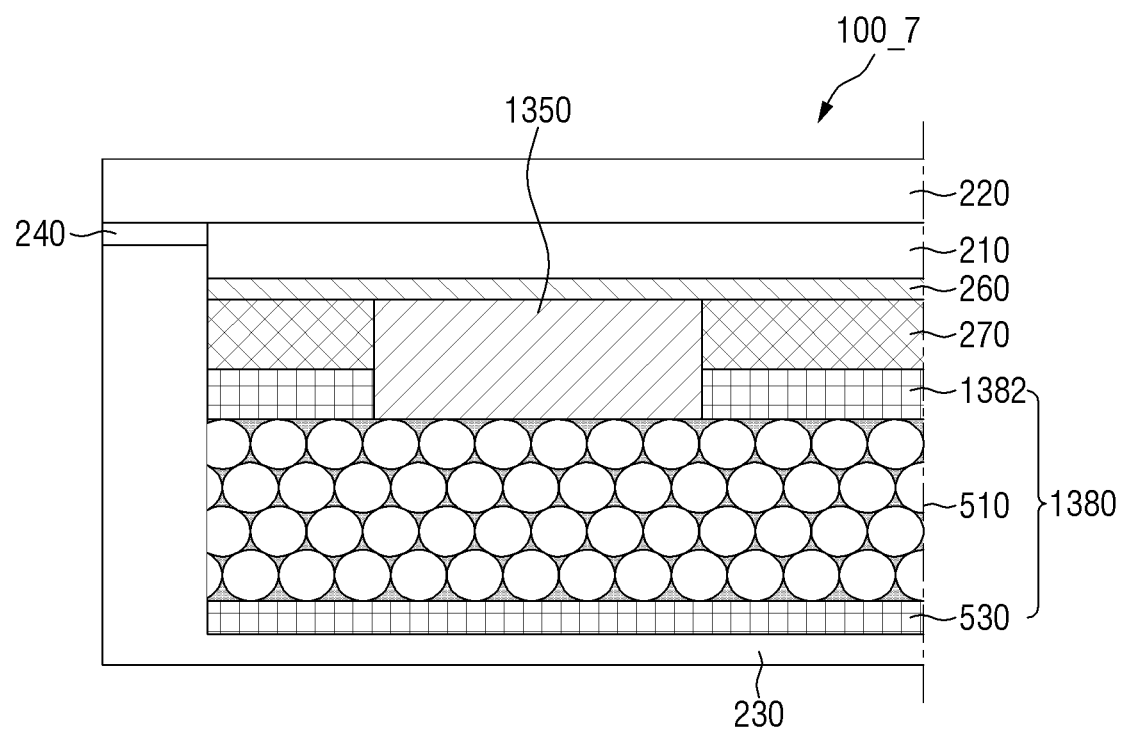

Referring to FIG. 13, a display device 100_7 is different from the display device 100 of FIG. 3 in that the former includes a sound generator 1350 and a porous layer 1380.

The sound generator 1350 may be substantially identical to the sound generator 250 described above with reference to FIG. 3.

The sound generator 1350 may have the thickness greater than that of the shock-absorbing layer 270. Accordingly, the thickness of the sound generator 1350 may be equal to the sum of the thickness of the shock-absorbing layer 270 and the thickness of the first coupling layer 1382. The first coupling layer 1382 may be included in the porous layer 1480 and may be substantially identical to the first coupling layer 520 described above with reference to FIG. 5.

Similarly to the first coupling layer 881 described above with reference to FIG. 8, the first coupling layer 1382 may overlap with the second overlap region RO2 but not with the first overlap region RO1. That is to say, the first coupling layer 1382 may include a hole corresponding to the shape of the sound generator 1350 (or the first overlap region RO1), and the first coupling layer 1382 may be attached to the lower surface of the shielding layer 260.

Figure 14:
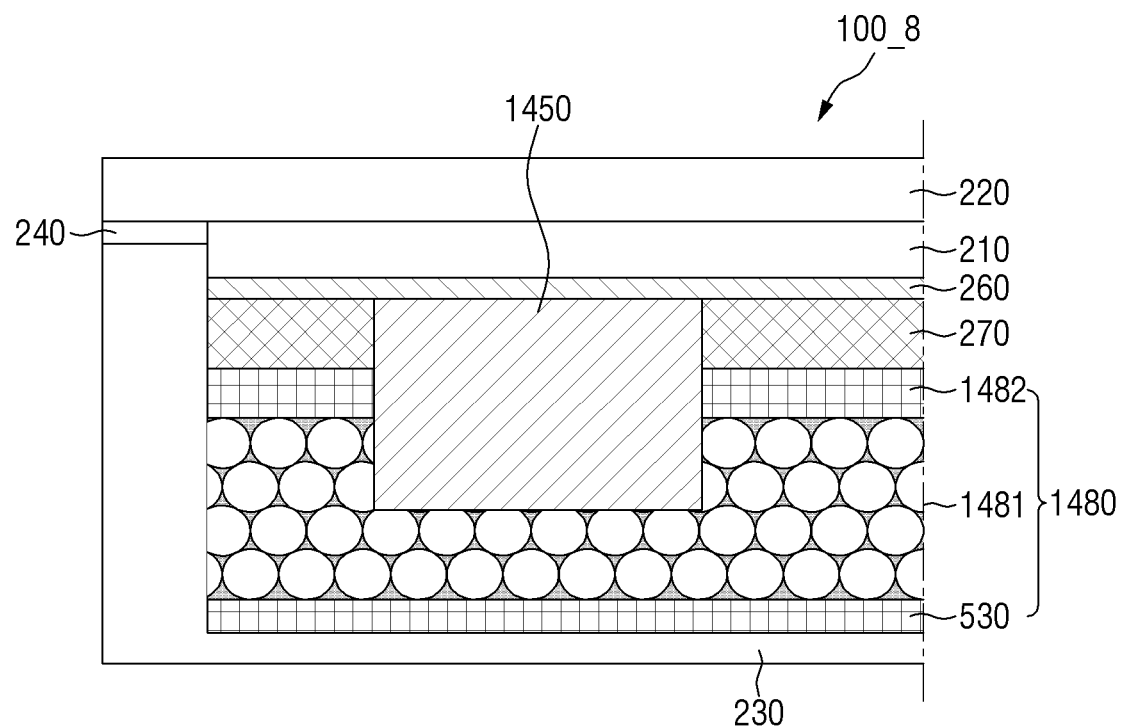

Referring to FIG. 14, a display device 100_8 is different from the display device 100_7 of FIG. 13 in that the former includes a sound generator 1450 and a porous layer 1480.

The sound generator 1450 may be substantially identical to the sound generator 250 described above with reference to FIG. 3.

The sound generator 1450 may be thicker than the sound generator 1350 described above with reference to FIG. 13. Accordingly, the thickness of the sound generator 1450 may be greater than the sum of the thickness of the shock-absorbing layer 270 and the thickness of the first coupling layer 1482. The first coupling layer 1482 may be included in the porous layer 1480 and may be substantially identical to the first coupling layer 1382 described above with reference to FIG. 13. The lower surface of the sound generator 1450 may protrude downward from the lower surface of the first coupling layer 1482.

The thickness of the first overlap region RO1 of the intermediate layer 1481 included in the porous layer 1480 may be smaller than the thickness of the second overlap region RO2.

Specifically, a groove may be formed in the upper surface of the intermediate layer 1481 corresponding to the shape of the sound generator 1450, and the sound generator 1450 may be inserted into the groove.

Figure 15:
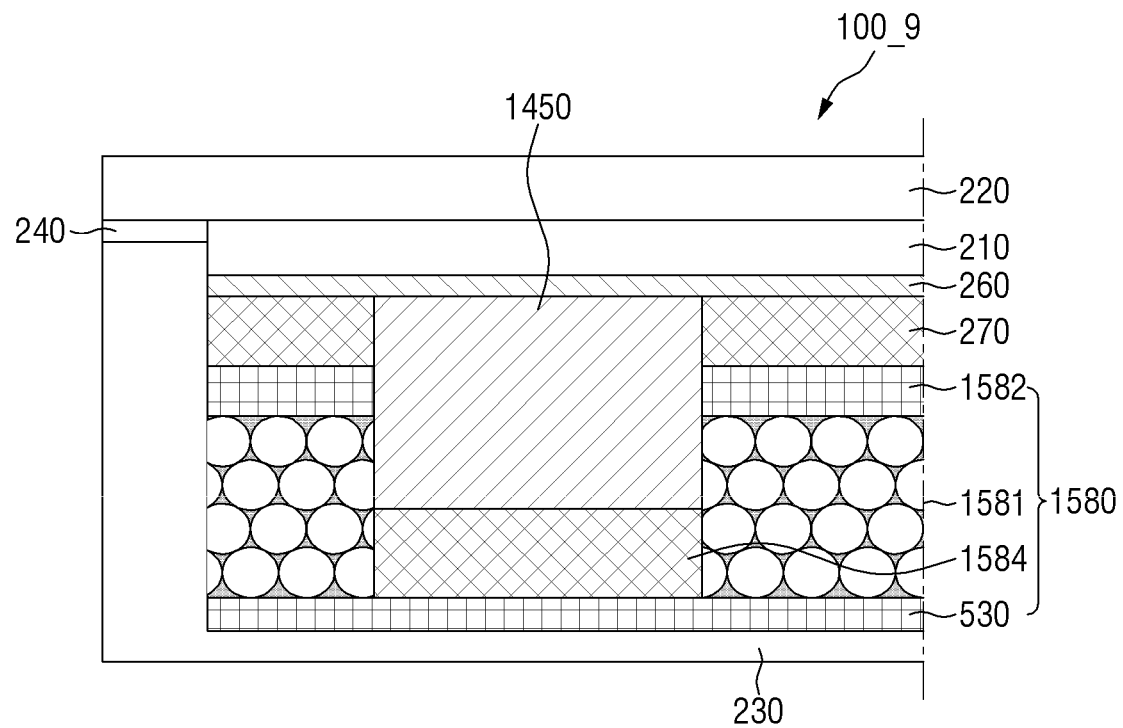

Referring to FIG. 15, a display device 100_9 is different from the display device 100_8 of FIG. 14 in that the former includes a porous layer 1580.

The porous layer 1580 may include an intermediate layer 1581, a first coupling layer 1582, a second coupling layer 530, and a third coupling layer 1584.

The first coupling layer 1582 may be substantially identical to the first coupling layer 1482 of FIG. 14.

The intermediate layer 1581 may include a hole formed in the first overlap region RO1 corresponding to the shape of the sound generator 1450. The hole may be formed such that it passes through the upper surface and the lower surface of the intermediate layer 1581. The height of the hole (i.e., the thickness of the intermediate layer 1581) may be larger than the height of the downwardly projecting portion of the sound generator 1450, i.e., the thickness of the portion of the sound generator 1450 that projects downwardly from the lower surface of the first coupling layer 1582.

When the sound generator 1450 is inserted into the hole of the intermediate layer 1581, a part of the hole may not be filled with the sound generator 1450. The part of the hole of the intermediate layer 1581 may be filled with a fourth coupling layer 1584.

The fourth coupling layer 1584 may be made of the same material as the shock-absorbing layer 270 or may be made of the same material as the first coupling layer 1582. For example, when the fourth coupling layer 1584 is made of the same material as the shock-absorbing layer 270, the upper surface of the fourth coupling layer 1584 may remain separated from the lower surface of the sound generator

1450. When the sound generator 1450 contracts/expands or the display panel 210 vibrates, the lower surface of the sound generator 1450 is separated from the upper surface of the fourth coupling layer 1584, such friction and impact may be generated. However, such friction and impact can be reduced by the fourth coupling layer 1584.

As another example, when the fourth coupling layer 1584 is made of the same material as the first coupling layer 1582, the lower surface of the sound generator 1450 may be coupled with the upper surface of the fourth coupling layer 1584. Even if the sound generator 1450 contracts/expands or the display panel 210 vibrates, no direct friction and impact may occur on the lower surface of the sound generator 1450, and the sound generator 1450 may vibrate with respect to the fourth coupling layer 1584 (or the frame 230) and may vibrate the display panel 210 relatively strongly.

Figure 16:
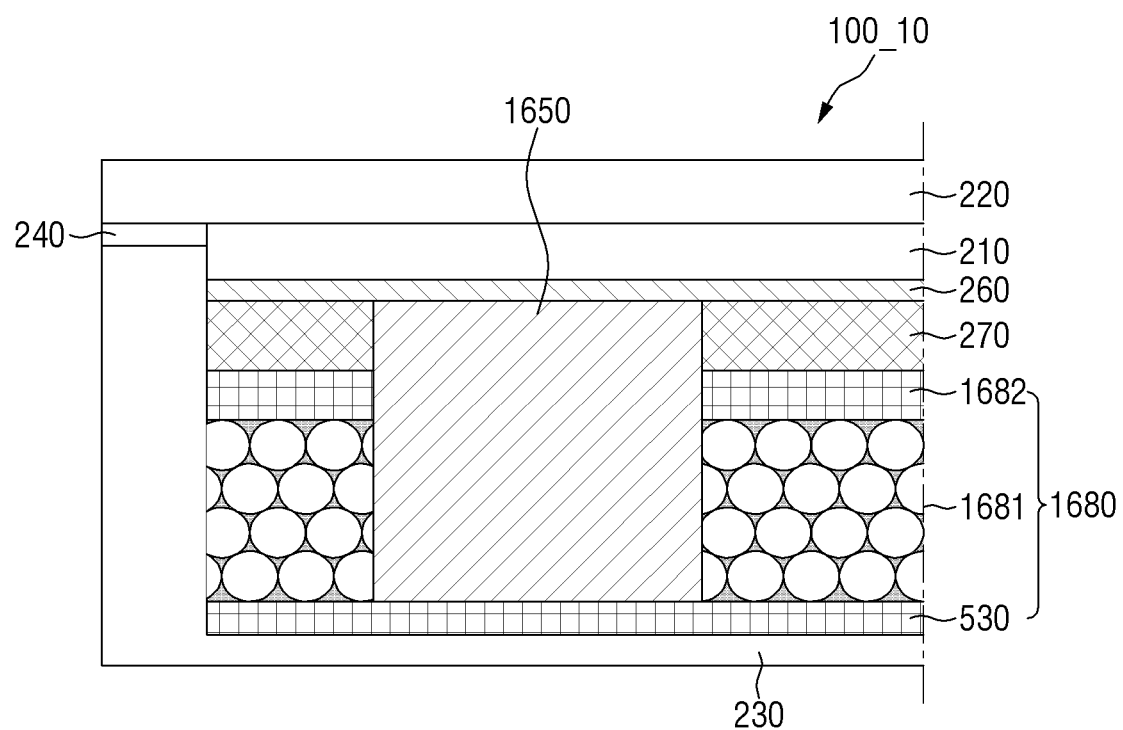

Referring to FIG. 16, a display device 100_10 is different from the display device 100_9 of FIG. 15 in that the former includes a sound generator 1650 and a porous layer 1680.

The porous layer 1680 includes an intermediate layer 1681, a first coupling layer 1682 and a second coupling layer 530. The intermediate layer 1681 and the first coupling layer 1682 may be substantially identical to the intermediate layer 1581 and the first coupling layer 1582, respectively, which are described above with reference to FIG. 15.

On the other hand, the thickness of the sound generator 1650 may be larger than the thickness of the sound generator 1450 described above with reference to FIG. 14 and may be equal to the overall thickness of the shock-absorbing layer 270, the first coupling layer 1682 and the intermediate layer 1681. That is to say, the sound generator 1650 may be extended to the upper surface of the second coupling layer 530, and the lower surface of the sound generator 1650 may come in contact with the upper surface of the second coupling layer 530.

The sound generator 1650 may be coupled to the frame 230 via the second coupling layer 530 and may vibrate with respect to the frame 230 and may vibrate the display panel 210 more strongly.

Figure 17:
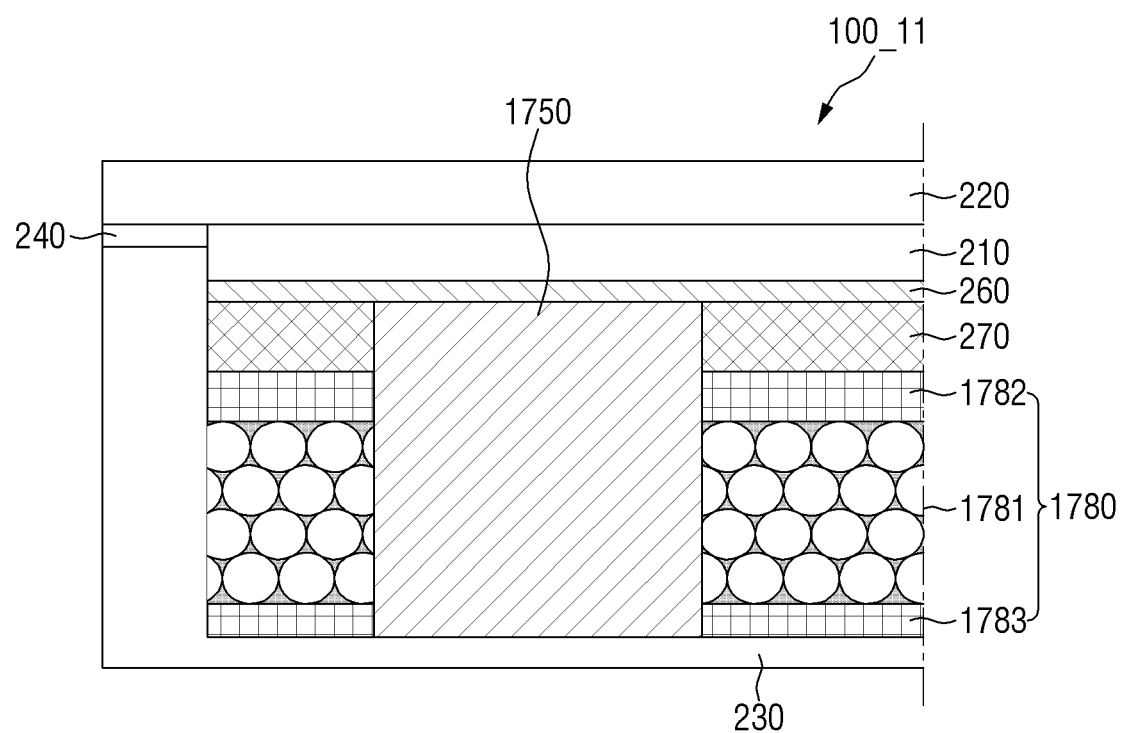

Referring to FIG. 17, a display device 100_11 is different from the display device 100_10 of FIG. 16 in that the former includes a sound generator 1750 and a porous layer 1780.

The porous layer 1780 includes an intermediate layer 1781, a first coupling layer 1782 and a second coupling layer 1783. The intermediate layer 1781 and the first coupling layer 1782 may be substantially identical to the intermediate layer 1681 and the first coupling layer 1682, respectively, which are described above with reference to FIG. 16.

The second coupling layer 1783 may be substantially identical to the second coupling layer 530 described above with reference to FIG. 5. The second coupling layer 1783 may include a hole corresponding to the shape of the sound generator 1750 (or the first overlap region RO1), similarly to the first coupling layer 1782.

The thickness of the sound generator 1750 may be larger than the thickness of the sound generator 1650 described above with reference to FIG. 16 and may be equal to the overall thickness of the shock-absorbing layer 270, the first coupling layer 1782, the intermediate layer 1781 and the second coupling layer 1783. That is to say, the sound generator 1650 may be extended to the upper surface of the frame 230, and the lower surface of the sound generator 1750 may come in contact with the upper surface of the frame 230. It is to be understood that the sound generator 1750 is not limited thereto, and the lower surface of the sound generator 1750 may be spaced from the upper surface of the frame 230.

By forming a single hole in the porous layer 1780 that passes through the first coupling layer 1782, the intermediate layer 1781 and the second coupling layer 1783, the process of fabricating the display device 100_11 can be simplified.

Figure 18:
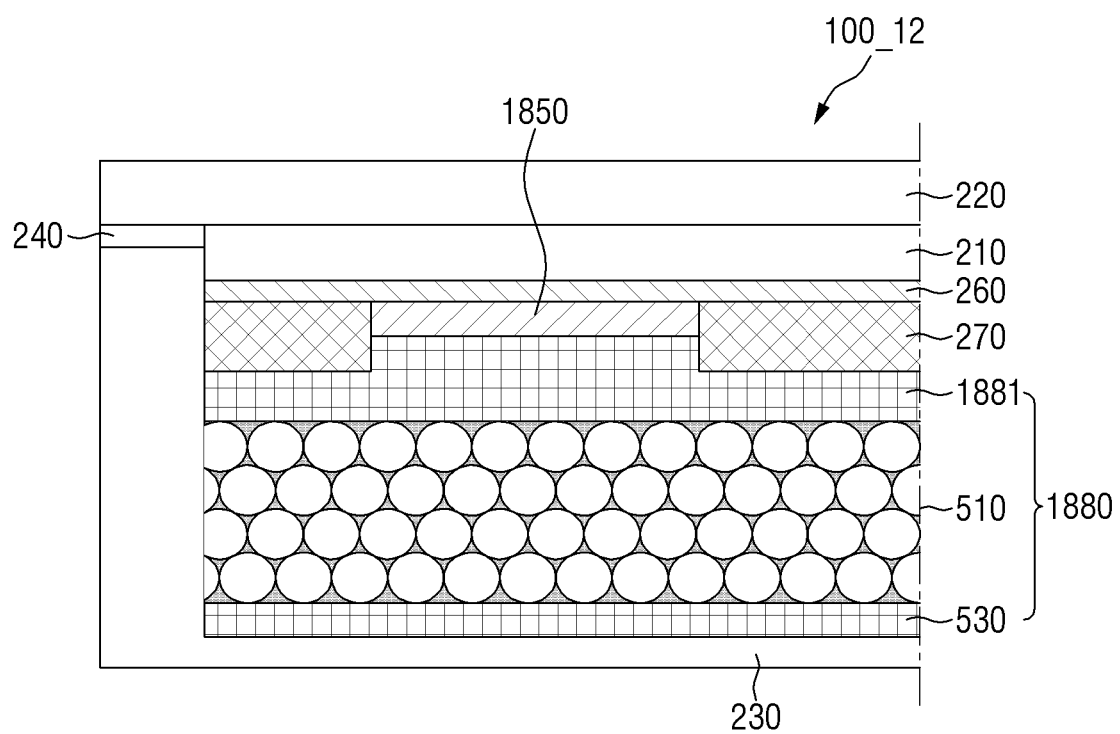

Referring to FIG. 18, a display device 100_12 is different from the display device 100_1 of FIG. 7 in that the former includes a sound generator 1850 and a porous layer 1880.

The sound generator 1850 may be substantially identical to the sound generator 750 described above with reference to FIG. 7. The thickness of the sound generator 1850 may be smaller than the thickness of the shock-absorbing layer 270.

The porous layer 1880 may include a first coupling layer 1881, an intermediate layer 510, and a second coupling layer 530.

The first coupling layer 1881 may include a generally convex protrusion projecting upward from the upper surface corresponding to the shape of the sound generator 1850 (or the first overlap region RO1). The sum of the height (or thickness) of the protrusion and the thickness of the sound generator 1850 may be equal to the thickness of the shock-absorbing layer 270.

That is to say, the first coupling layer 1881 may be coupled with the lower surface of the sound generator 1850 via the convex portion, may remove the spacing between the sound generator 1850 and the porous layer 1880, and may prevent friction and impact between the sound generator 1850 and the porous layer 1880.

Figure 19:
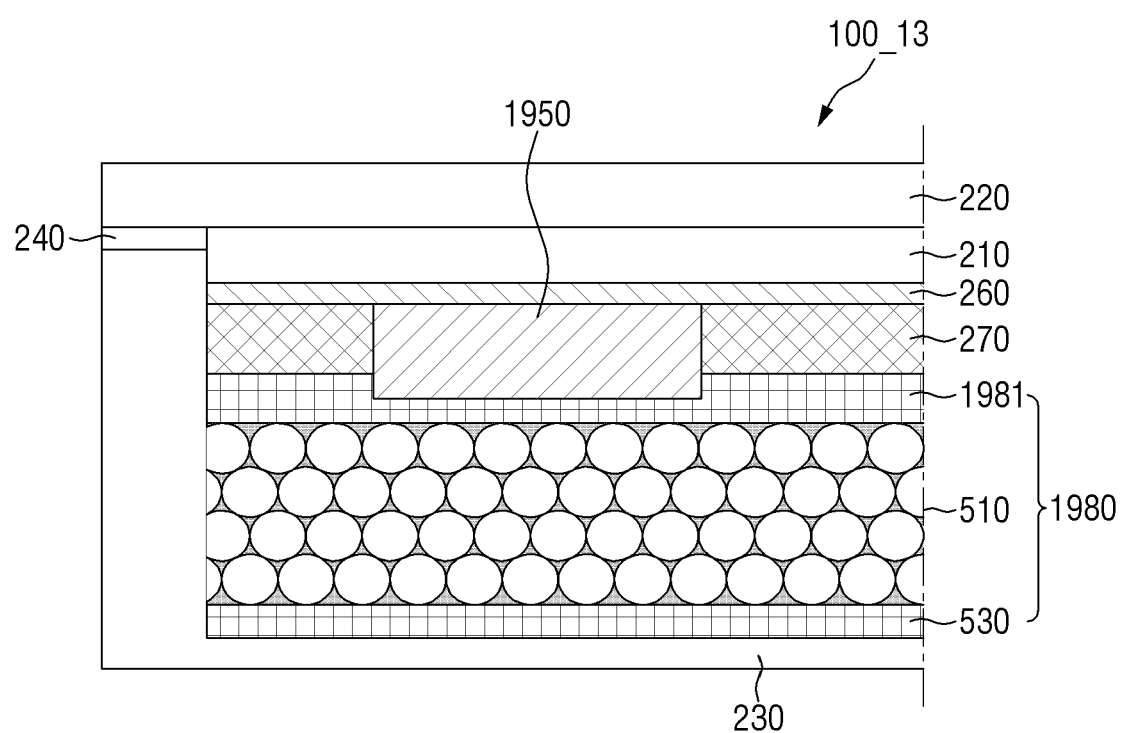

Referring to FIG. 19, a display device 100_13 is different from the display device 100_1 of FIG. 7 in that the former includes a sound generator 1950 and a porous layer 1980.

The sound generator 1950 may be substantially identical to the sound generator 750 described above with reference to FIG. 7. The thickness of the sound generator 1850 may be larger than the thickness of the shock-absorbing layer 270 and smaller than the overall thickness of the shock-absorbing layer 270 and the first coupling layer 1981.

The porous layer 1980 may include a first coupling layer 1981, an intermediate layer 510, and a second coupling layer 530.

The first coupling layer 1981 may include a groove cut into the upper surface corresponding to the shape of the sound generator 1850 (or the first overlap region RO1). The thickness of the first coupling layer 1981 in the first overlap region RO1 may be smaller than that in the second overlap region RO2. The sum of the thickness of the sound generator 1850 and the thickness of the first coupling layer 1981 in the first overlap region RO1 may be equal to the sum of the thickness of the shock-absorbing layer 270 and the thickness of the second overlap region RO2.

Figure 20:
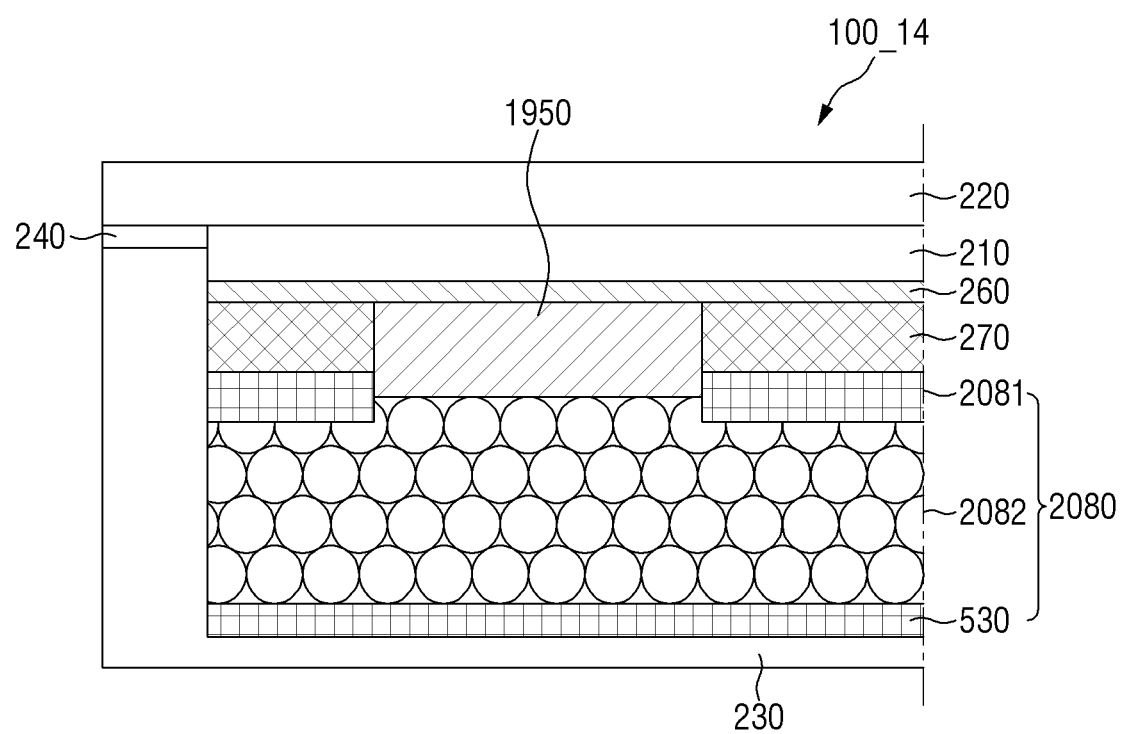

Referring to FIG. 20, a display device 100_14 is different from the display device 100_13 of FIG. 19 in that the former includes a porous layer 2080.

The porous layer 1980 may include a first coupling layer 2081, an intermediate layer 2082, and a second coupling layer 530.

The first coupling layer 2081 may include a hole formed corresponding to the shape of the sound generator 1950 (or the first overlap region RO1).

The intermediate layer 2082 may include a protrusion on the upper surface corresponding to the shape of the sound generator 1950. The thickness of the first overlap region RO1 of the intermediate layer 2082 may be larger than the thickness of the second overlap region RO2. The sum of the thickness of the sound generator 1950 and the thickness of the intermediate layer 2082 may be equal to the sum of the thickness of the shock-absorbing layer 270 and the thickness of a portion of the first coupling layer 2081 that overlaps with the intermediate layer 2082 in the thickness direction.

As described with reference to FIGS. 7 to 20, the display device may include sound generators of various sizes, and may include porous layers including holes, grooves, or protrusions accordingly. Further, the porous layer includes the first coupling layer and/or the second coupling layer to adjust the thickness of the diaphragm (i.e., the element vibrating in combination with the display panel 210) to meet the required pressure. Further it is possible to prevent or reduce the friction and impact on the lower surface of the sound generator.

Figure 21:
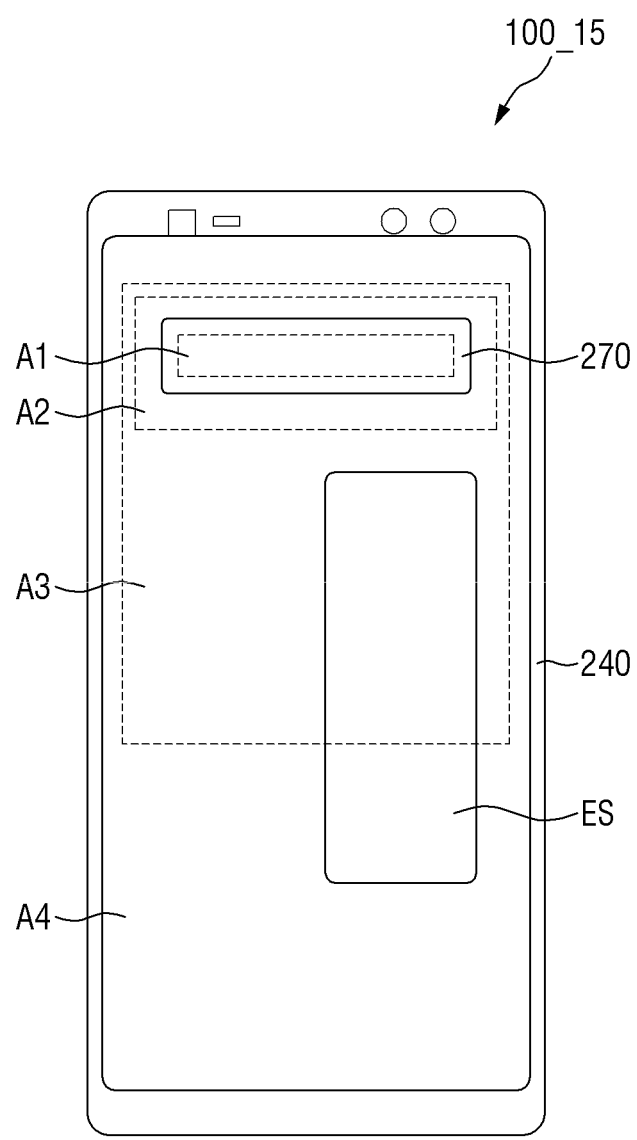
FIG. 21 is a plan view of a display device constructed according to another exemplary embodiment of the invention.

FIG. 21 is a plan view of a display device constructed according to another exemplary embodiment of the invention.

Referring to FIGS. 1 to 3 and 21, a display device 100_15 includes a porous layer 280, and the porous layer 280 may overlap with one of the first to fourth areas A1 to A4.

That is to say, the porous layer 280 may be disposed between the sound generator 250 and the frame 230 (and between the shock-absorbing layer 270 and the frame 230) and may have different sizes (or areas) in the cross-sectional view.

For example, the porous layer 280 may be disposed in the first area A1. The porous layer 280 has an area smaller than the area of the sound generator 250 when viewed in plan and may completely overlap with the sound generator 250. The porous layer 280 may be disposed only between the sound generator 250 and the frame 230 in the cross-sectional view, and it is possible to prevent or mitigate friction and impact generated between the sound generator 250 and the frame 230 due to the contraction/expansion of the sound generator 250. In this case, a shock-absorbing layer 270 may be disposed in the other areas of the frame 230 than the area where the porous layer 280 is disposed, or the frame 230 itself may have a groove corresponding to the shape of the porous layer 280.

In another example, the porous layer 280 may be disposed in the second area A2. The porous layer 280 has an area larger than the area of the sound generator 250 when viewed in plan and may completely overlap with the sound generator 250. That is to say, the porous layer 280 may surround the sound generator 250. The porous layer 280 may be disposed between the sound generator 250 and the frame 230 in the cross-sectional view, and the porous layer 280 may be partially overlapped with the shock-absorbing layer 270.

In another example, the porous layer 280 may be disposed in the third region A3. The porous layer 280 has an area larger than the area of the sound generator 250 when viewed in plan, may completely overlap with the sound generator 250 and may be connected to an empty space ES. The empty space ES may be formed by the first and second holes HOLE1 and HOLE2 described above with reference to FIG. 2 (e.g., a space where a battery device is mounted). In addition, the porous layer 280 may not overlap with the empty space ES.

The porous layer 280 may connect the first space where the sound generator 250 is disposed with the empty space ES to form them as a single resonance space. As a result, the acoustic characteristics of the display device 100_19 can be improved.

In another example, the porous layer 280 may be disposed in the fourth area A4. The porous layer 280 has an area similar to the area of the bottom of the frame 230 (i.e., the area of the frame 230 excluding the side walls and the empty space ES) in the plan view and may be disposed between the display panel 210 and the frame 230 in the plan view.

In this case, the entire display panel 210 may freely vibrate independently of the frame 230, and the entire lower surface of the display panel 210 can be protected from moisture or the like.

As described above, the porous layer 280 may have various areas viewed in plan. In particular, the porous layer 280 may connect the first space where the sound generator 250 is disposed with the empty space ES, so that the acoustic characteristics of the display device 100_19 can be improved. Further, it is possible to cover the entire lower surface of the display panel 210 and protect it from moisture or the like.

Although the display device 100_15 is described as including the empty space ES in FIG. 21, this is merely illustrative. The display device 100_15 is not limited thereto. For example, the display device 100_15 may not include the empty space ES.

Figure 22:
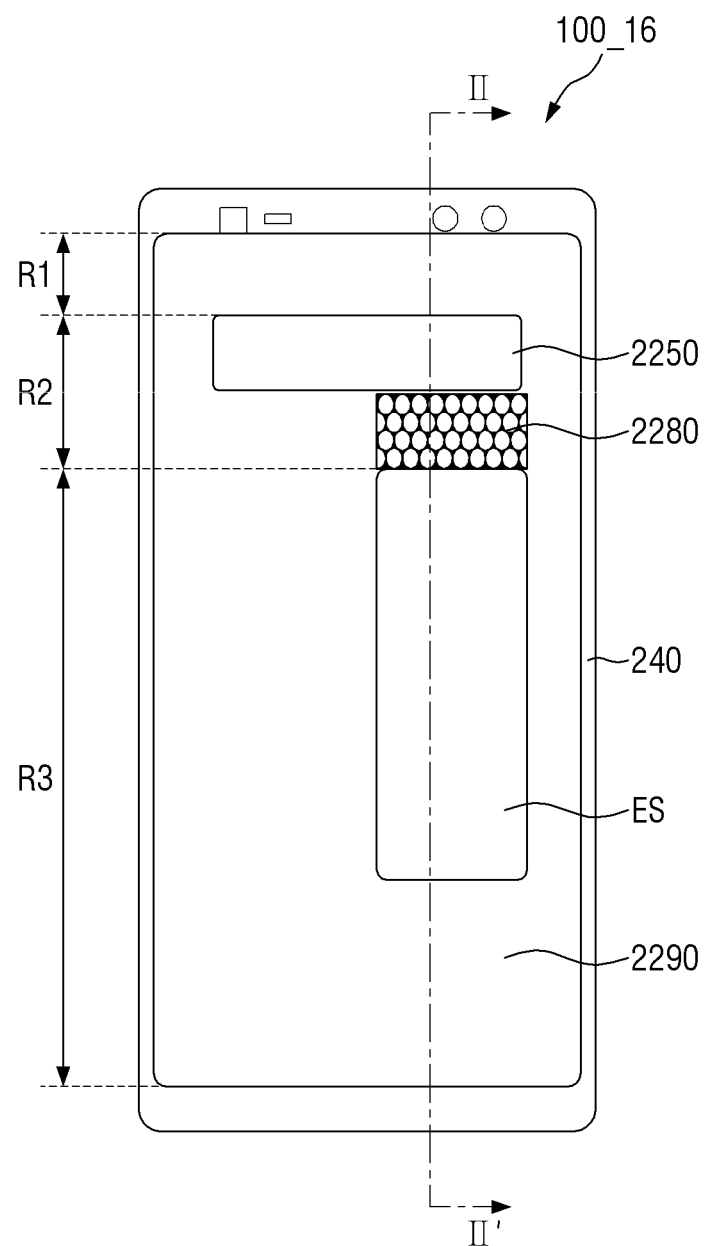
FIG. 22 is a plan view of a display device constructed according to yet another exemplary embodiment of the invention.
Figure 23:
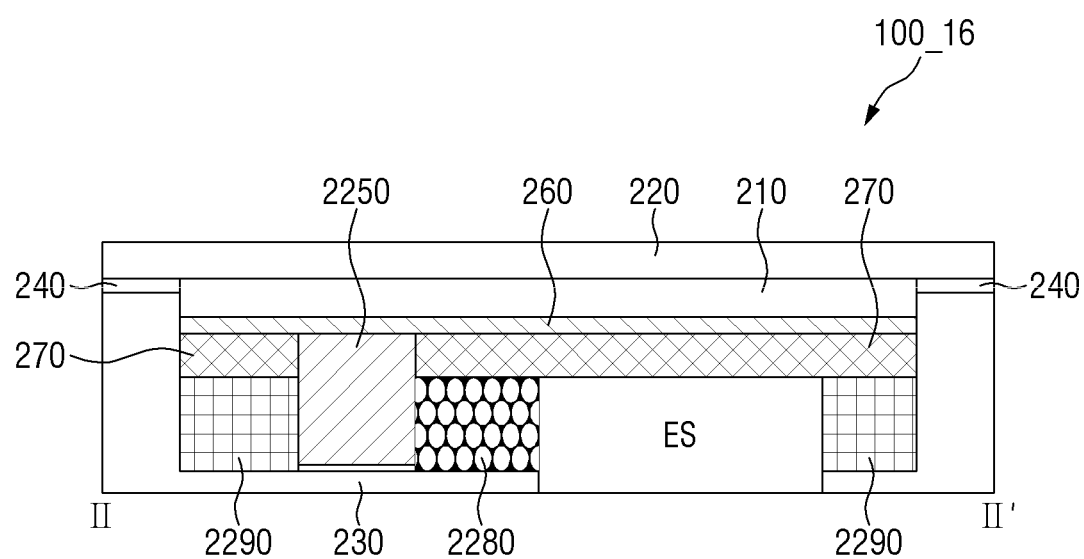
FIG. 23 is a cross-sectional view taken along line II-II' of FIG. 22.

FIG. 22 is a plan view of a display device constructed according to yet another exemplary embodiment of the invention. FIG. 23 is a cross-sectional view taken along line II-II' of FIG. 22.

Referring to FIGS. 22 and 23, a display device 100_16 is different from the display device 100 of FIG. 3 in that the former includes a sound generator 2250 and a porous layer 2280 and further includes a heat reactive layer 2290. The sound generator 2250 may be substantially identical to the sound generator 250 described above with reference to FIG. 3.

The thickness of the sound generator 2250 may be equal to or less than the spacing distance between the shielding layer 260 and the frame 230 (i.e., the distance in the vertical direction in the cross-sectional view).

The sound generator 2250 may be coupled to the display panel 210 and may be separated from the frame 230. Although not shown in FIG. 23, when the sound generator 2250 is separated from the frame 230, a separate support member may be interposed between the sound generator 2250 and the frame 230 so that the friction and impact between the sound generator 2250 and the frame 230 can be mitigated.

On the other hand, the sound generator 2250 may be disposed on the second region R2 in the plan view, as shown in FIG. 22. The frame 230 may include first to third regions R1 to R3 sequentially stacked on one another in the vertical direction in the plan view. A camera device or the like may be disposed in the first region R1, and accordingly a separate hole may be formed in the first region R1 of the frame 230. Similarly, the third region R3 of the frame 230 may include an empty space where a battery device or the like is disposed. The sound generator 2250 may be disposed in the second region R2 of the frame 230 and interference with or influence on the camera device, the battery device, and the like can be reduced.

The porous layer 2280 may be disposed between the shock-absorbing layer 270 and the frame 230, and between the sound generator 2250 and the empty space ES.

As shown in FIG. 22, the porous layer 2280 may have a width equal to the width (e.g., width in the left-and-right direction) of the empty space ES and may come in contact with the entire upper side of the empty space ES, and with a part of the lower side of the sound generator 2250. That is to say, in the plan view, the porous layer 2280 may have a shape extended upward from the empty space ES.

By doing so, the area of the porous layer 2280 can be reduced, such that the influence by vibration on other devices can be reduced, and the resonance space can be increased.

On the other hand, the heat reactive layer 2290 may be disposed between the frame 230 (or the bottom of the frame 230) and the display panel 210, and in the remaining area (i.e., except the area where the sound generator 2250, the porous layer 2280 and the empty space ES are disposed).

That is to say, the heat reactive layer 2290 has the same shape as the remaining area and may be interposed between the frame 230 and the display panel 210 (or the shock-absorbing layer 270).

Similarly to the second coupling layer 530 described above with reference to FIG. 4A, the heat reactive layer 2290 includes a heat reactive material, so that the friction/impact generated between the frame 230 and the display panel 210 and noise therefrom when the display panel 210 vibrates can be removed or mitigated.

Figure 24:
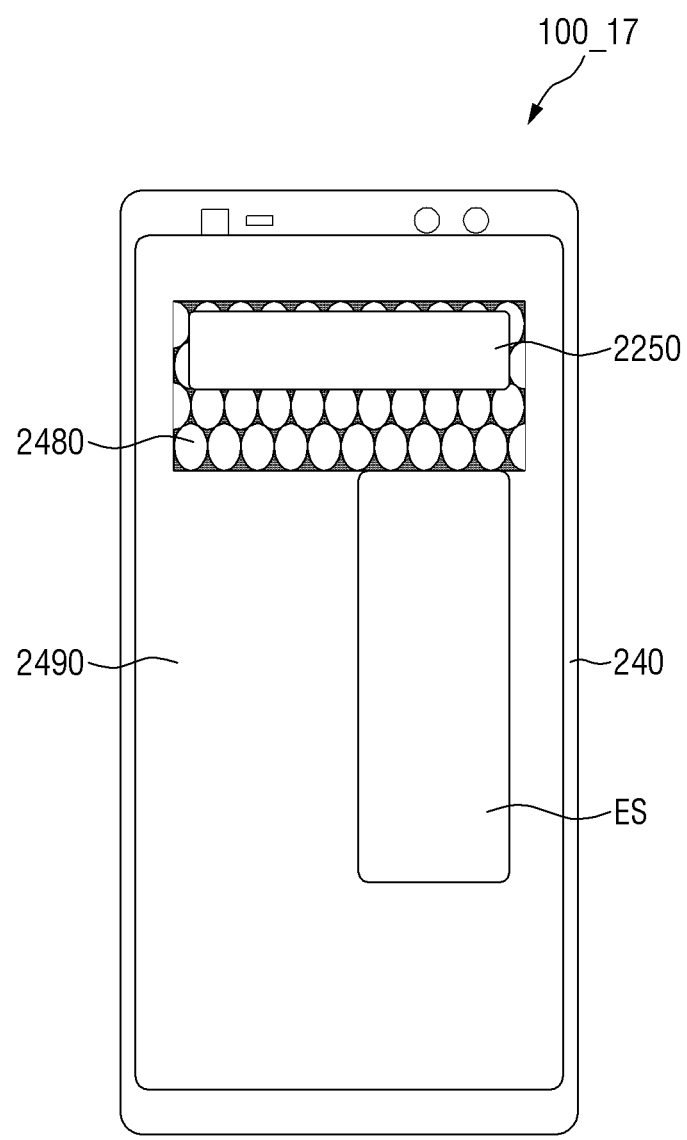
FIGS. 24, 25, and 26 are plan views of display devices constructed according to a variety of additional exemplary embodiments of the invention.
Figure 25:
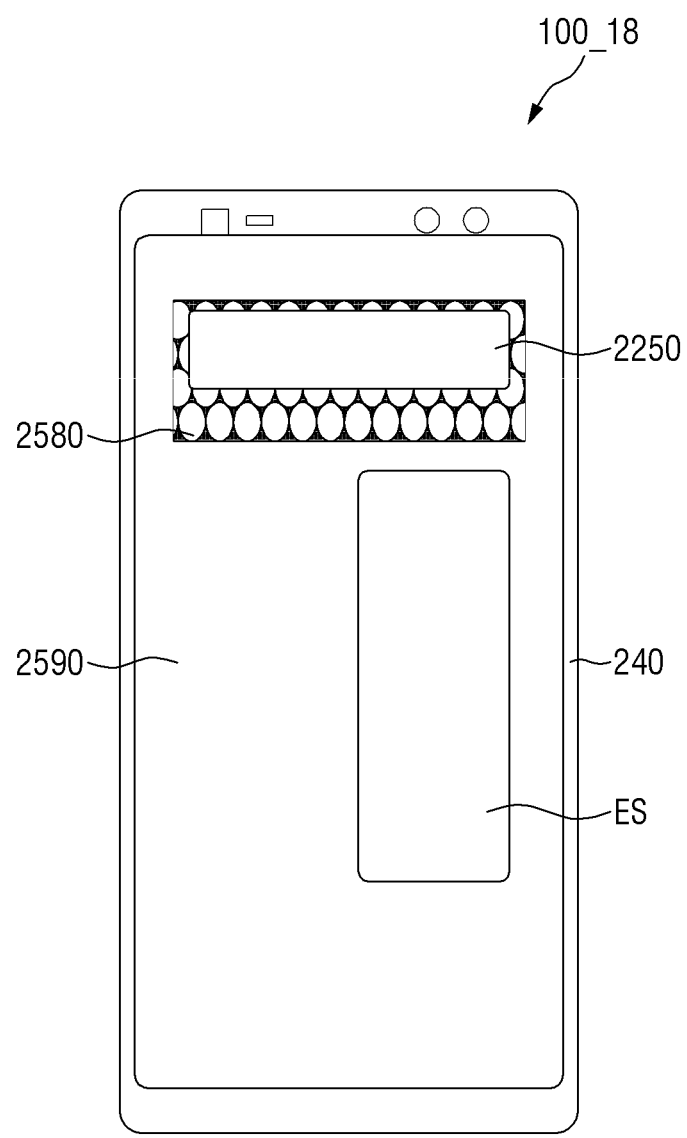
Figure 26:
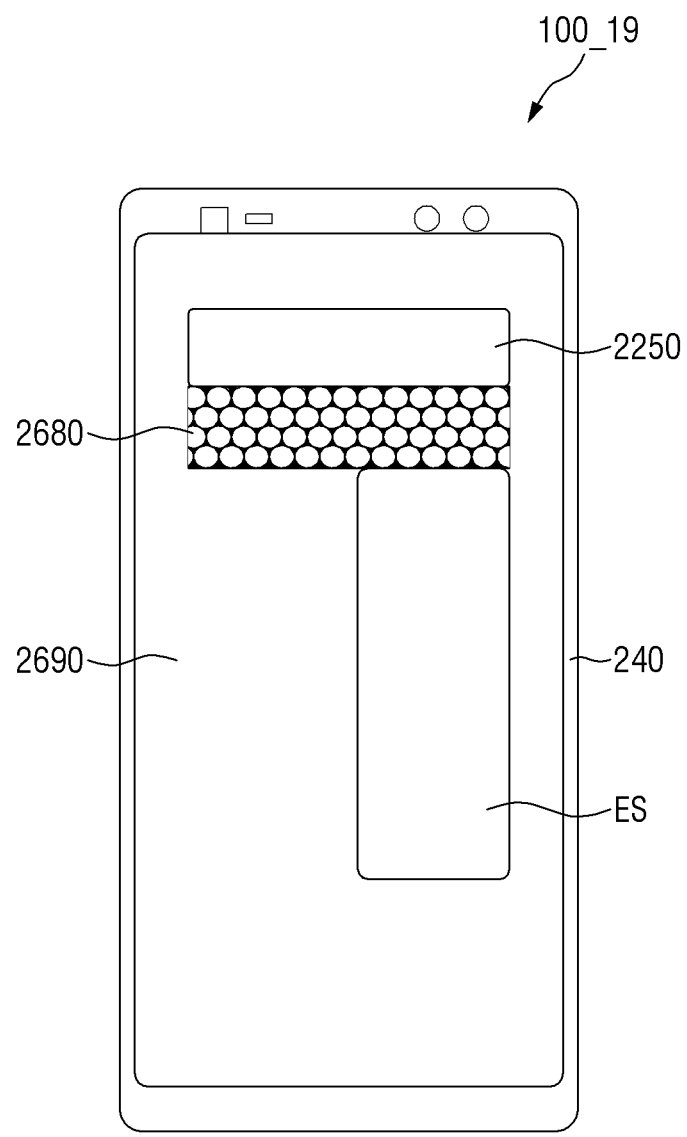

FIGS. 24 to 26 are plan views of display devices constructed according to a variety of additional exemplary embodiments of the invention.

Referring to FIG. 24, a display device 100_17 is different from the display device 100_16 of FIG. 22 in that the former includes a porous layer 2480 and a heat reactive layer 2490.

The porous layer 2480 may have a larger area than the sound generator 2250 in the plan view and may surround the sound generator 2250 so that the first space where the sound generator 2250 is disposed can be connected to the empty space ES. Since the porous layer 2480 has a shape that surrounds the sound generator 2250, direct influence on other devices (e.g., a camera device located in the first region R1) by the vibration of the sound generator 2250 can be reduced.

Similarly to the heat reactive layer 2290 described above with reference to FIG. 22, the heat reactive layer 2290 may be disposed between the frame 230 and the display panel 210, and in the remaining area (i.e., except the area where the sound generator 2250, the porous layer 2280 and the empty space ES are disposed).

Although the porous layer 2480 is shown as covering only the side surfaces of the sound generator 2250 in FIG. 24, the invention is not limited thereto. For example, the porous layer 2480 may be interposed between the sound generator 2250 and the frame 230 in the cross-sectional view.

Referring to FIG. 25, a display device 100_18 is different from the display device 100_17 of FIG. 22 in that the former includes a porous layer 2580.

The porous layer 2480 may have a larger area than the sound generator 2250 in the plan view and may surround the sound generator 2250, but may not be connected to the empty space ES.

The display device 100_18 may require a plurality of resonance spaces corresponding to the various frequency bands, respectively, and the display device 100_18 may include a separate resonance space using the porous layer 2580 in addition to the empty space ES.

Referring to FIG. 26, a display device 100_19 is different from the display device 100_17 of FIG. 22 in that the former includes a porous layer 2680.

The porous layer 2480 has the length equal to the length (i.e., the length in the left-and-right direction) of the sound generator 2250 in the plan view and may be extended downward from the lower side of the sound generator 2250 to come in contact with the empty space ES.

In this case, the porous layer 2480 can suppress the influence by vibration on the first and third regions R1 and R3 described above with reference to FIG. 22 and can increase the resonance space by utilizing the smallest area.

Figure 27:
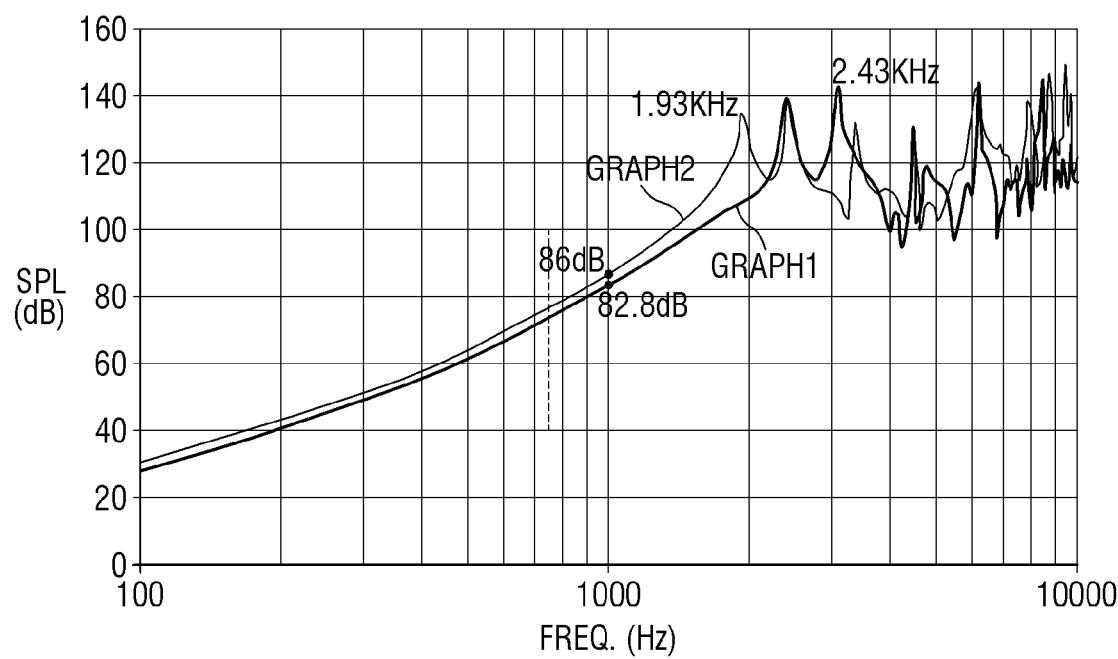
FIG. 27 is a graph illustrating acoustic characteristics of a display device constructed according to still another exemplary embodiment.

FIG. 27 is a graph illustrating acoustic characteristics of a display device constructed according to still another exemplary embodiment.

Referring to FIGS. 22 and 27, the horizontal axis represents the frequency FREQ, and the vertical axis represents the sound pressure level (SPL).

A first curve GRAPH1 shows the acoustic characteristics of the display device including only the heat reactive layer 2290 without the porous layer 2280, and a second curve GPAPH2 shows the acoustic characteristics of the display device 100_16 of FIG. 22. The heat reactive layer 2290 may have the modulus of approximately 3 MPa, and the porous layer 2280 may have the modulus of about 0.5 MPa or less.

As shown in FIG. 27, the first curve GRAPH1 has the sound pressure of 82.8 dB and the resonance frequency of 2.43 KHz for the frequency of 1 KHz.

The second curve GRPAPH2 has the sound pressure of 86 dB and the resonance frequency of 1.93 KHz for the frequency of 1 KHz.

That is to say, a display device 100_16 has the sound pressure (or sound level) improved by approximately 4 dB (or twice or more) in the audible frequency band and can also amplify and output sound using a lower resonance frequency.

Therefore, the acoustic characteristics of the display device 100_16 can be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel;
    a sound generator under the display panel;
    a frame disposed under the display panel and the sound generator; and
    a porous layer disposed adjacent to the sound generator between the display panel and the frame and having a plurality of air pockets; and
    a shock-absorbing layer between the display panel and the porous layer to surround side surfaces of the sound generator,
    wherein the porous layer has a porosity of 90% or more, and the display panel is vibratable independently of the frame,
    wherein the shock-absorbing layer overlaps the porous layer in a thickness direction of the display panel, and does not overlap the sound generator in the thickness direction of the display panel, and
    wherein the porous layer overlaps the sound generator and the shock-absorbing layer in the thickness direction of the display panel.

2. The display device of claim 1, wherein the porous layer has a network structure.

3. The display device of claim 1, wherein two or more of the air pockets are spatially interconnected.

4. The display device of claim 3, wherein the air pockets are staggered in a horizontal direction so there is no continuous connection in the porous layer along a path formed by the shortest distance between the frame and the display panel.

5. The display device of claim 1, wherein an average diameter of the air pockets is greater than 20 nm and less than 50 nm.

6. The display device of claim 1, wherein an average diameter of the air pockets is greater than 50 nm, and the porous layer comprises a methoxy group.

7. The display device of claim 1, wherein the porous layer has a modulus ranging from 0.5 MPa to 0.05 MPa.

8. The display device of claim 1, wherein the porous layer comprises silicon dioxide ($SiO_2$).

9. The display device of claim 1, wherein the sound generator and frame are disposed under the display panel, and the porous layer comprises:
 a first coupling layer overlapping the sound generator and attached to a lower surface of the sound generator;
 a second coupling layer attached to an upper surface of the frame; and
 an intermediate layer interposed between the first and second coupling layers and coupled to the first coupling layer and the second coupling layer, wherein the intermediate layer comprises the air pockets.

10. The display device of claim 9,
 wherein the shock-absorbing layer defines a hole corresponding to an outer periphery of the sound generator and is disposed between the display panel and the porous layer to surround side surfaces of the sound generator, and
 wherein an upper surface of the first coupling layer comes in contact with a lower surface of the sound generator and a lower surface of the shock-absorbing layer.

11. The display device of claim 1, wherein the porous layer comprises:
 a first coupling layer defining a hole corresponding to an outer periphery of the sound generator and abutting the sound generator,
 a second coupling layer attached to an upper surface of the frame, and
 an intermediate layer interposed between the first and second coupling layers and comprising the air pockets,
 wherein the intermediate layer abuts a lower surface of the sound generator through the hole of the first coupling layer.

12. The display device of claim 1, further comprising:
 a shock-absorbing layer defining a hole corresponding to an outer periphery of the sound generator and disposed between the display panel and the porous layer to surround side surfaces of the sound generator,
 wherein the porous layer comprises
 a second coupling layer attached to an upper surface of the frame, and
 an intermediate layer disposed on the second coupling layer and comprising the air pockets,
 wherein the intermediate layer comes abuts a lower surface of the sound generator and a lower surface of the shock-absorbing layer.

13. The display device of claim 1, further comprising:
 a shock-absorbing layer defining a hole corresponding to an outer periphery of the sound generator and disposed between the display panel and the porous layer to surround side surfaces of the sound generator,
 wherein the porous layer comprises
 a first coupling layer attached to a lower surface of the sound generator and a lower surface of the shock-absorbing layer, and
 an intermediate layer disposed under the first coupling layer and comprising the air pockets,
 wherein the intermediate layer abuts an upper surface of the frame.

14. The display device of claim 1, wherein the porous layer comprises
 a second coupling layer attached to an upper surface of the frame, and
 an intermediate layer disposed on the second coupling layer and comprising the air pockets,
 wherein the intermediate layer comprises a groove corresponding to an outer periphery of the sound generator, the sound generator having side surfaces and a lower surface received in and abutting the groove.

15. The display device of claim 1, wherein the porous layer comprises:
 a first coupling layer defining a first hole corresponding to an outer periphery of the sound generator and coupled with a lower surface of the display panel,
 a second coupling layer attached to an upper surface of the frame,
 an intermediate layer interposed between the first and second coupling layers and defining a second hole overlapping with the first hole, and
 a fourth coupling layer connecting the sound generator with the second coupling layer.

16. The display device of claim 1, wherein the porous layer comprises:
 a first coupling layer coupled with a lower surface of the display panel,
 a second coupling layer attached to an upper surface of the frame,
 an intermediate layer interposed between and coupled to the first coupling layer and the second coupling layer and comprising the air pockets, and
 a hole in the first coupling layer, the second coupling layer and the intermediate layer, the hole overlapping the sound generator, and
 wherein a lower surface of the sound generator abuts an upper surface of the frame through the hole.

17. The display device of claim 1, wherein the frame defines a hole spaced away from the sound generator in a thickness direction, and
 wherein the porous layer has a substantially uniform thickness extending from one side surface of the sound generator to the hole.

18. The display device of claim 17, wherein the porous layer is disposed in a shortest path from one surface of the hole to the sound generator, and wherein a length of one side of the porous layer is equal to a length of the one surface of the hole.

19. The display device of claim 18, further comprising:
 a heat reactive layer disposed between the display panel and the frame, wherein the heat reactive layer is spaced apart from the porous layer in a thickness direction.

20. The display device of claim 1, wherein the porous layer contacts at least a portion of side surfaces of the sound generator.

* * * * *